(12) United States Patent
Kobayashi et al.

(10) Patent No.: US 8,824,194 B2
(45) Date of Patent: Sep. 2, 2014

(54) SEMICONDUCTOR DEVICE AND METHOD FOR DRIVING THE SAME

(75) Inventors: Hidetomo Kobayashi, Isehara (JP); Yutaka Shionoiri, Isehara (JP); Tatsuji Nishijima, Hadano (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 247 days.

(21) Appl. No.: 13/472,741

(22) Filed: May 16, 2012

(65) Prior Publication Data

US 2012/0294067 A1 Nov. 22, 2012

(30) Foreign Application Priority Data

May 20, 2011 (JP) ................................. 2011-113275

(51) Int. Cl.
*G11C 11/24* (2006.01)

(52) U.S. Cl.
USPC .......................................... 365/149; 365/205

(58) Field of Classification Search
USPC ................................. 365/149, 205
See application file for complete search history.

(56) References Cited

U.S. PATENT DOCUMENTS

| | | | |
|---|---|---|---|
| 5,197,131 | A | 3/1993 | Mori et al. |
| 5,528,032 | A | 6/1996 | Uchiyama |
| 5,731,856 | A | 3/1998 | Kim et al. |
| 5,744,864 | A | 4/1998 | Cillessen et al. |
| 6,294,274 | B1 | 9/2001 | Kawazoe et al. |
| 6,563,174 | B2 | 5/2003 | Kawasaki et al. |
| 6,727,522 | B1 | 4/2004 | Kawasaki et al. |
| 7,049,190 | B2 | 5/2006 | Takeda et al. |
| 7,061,014 | B2 | 6/2006 | Hosono et al. |
| 7,064,346 | B2 | 6/2006 | Kawasaki et al. |

(Continued)

FOREIGN PATENT DOCUMENTS

| | | |
|---|---|---|
| EP | 1737044 A | 12/2006 |
| EP | 2226847 A | 9/2010 |

(Continued)

OTHER PUBLICATIONS

International Search Report (Application No. PCT/JP2012/062571) dated Jun. 12, 2012.

(Continued)

*Primary Examiner* — Son Dinh
*Assistant Examiner* — Nam Nguyen
(74) *Attorney, Agent, or Firm* — Eric J. Robinson; Robinson Intellectual Property Law Office, P.C.

(57) ABSTRACT

In a semiconductor device performing pipeline processing with the use of a reading portion reading an instruction and an arithmetic portion performing an operation in accordance with the instruction, the instruction held in the reading portion is transmitted from the flip-flop to the memory when branch prediction turns out to be wrong. Note that the arithmetic portion controls transmission and reception of the instruction between the flip-flop and the memory which are included in the reading portion. This enables elimination of redundant operations in the reading portion in the case where an instruction read by the reading portion after the branch prediction turns out to be wrong is a subroutine, or the like. That is, the instruction held in the memory is transmitted back to the flip-flop without rereading of the same instruction by the reading portion, whereby the instruction can be output to the arithmetic portion.

6 Claims, 14 Drawing Sheets

(56) References Cited

U.S. PATENT DOCUMENTS

| | | |
|---|---|---|
| 7,105,868 B2 | 9/2006 | Nause et al. |
| 7,191,308 B2 | 3/2007 | Hara et al. |
| 7,211,825 B2 | 5/2007 | Shih et al |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,535,782 B2 * | 5/2009 | Vernet et al. ............... 365/205 |
| 7,552,311 B2 | 6/2009 | Hara et al. |
| 7,599,212 B2 * | 10/2009 | Cheng et al. ............... 365/149 |
| 7,674,650 B2 | 3/2010 | Akimoto et al. |
| 7,732,819 B2 | 6/2010 | Akimoto et al. |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager et al. |
| 2004/0038446 A1 | 2/2004 | Takeda et al. |
| 2004/0127038 A1 | 7/2004 | Carcia et al. |
| 2004/0133769 A1 | 7/2004 | Chaudhry et al. |
| 2004/0205301 A1 | 10/2004 | Hara et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0068773 A1 | 3/2009 | Lai et al. |
| 2009/0070569 A1 | 3/2009 | Nagao et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2011/0101332 A1 | 5/2011 | Yamazaki et al. |
| 2011/0101351 A1 | 5/2011 | Yamazaki |
| 2011/0121878 A1 | 5/2011 | Kato et al. |

FOREIGN PATENT DOCUMENTS

| | | |
|---|---|---|
| JP | 60-196861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 01-205228 A | 8/1989 |
| JP | 05-251705 A | 9/1993 |
| JP | 06-275697 A | 9/1994 |
| JP | 08-264794 A | 10/1996 |
| JP | 11-505377 | 5/1999 |
| JP | 2000-044236 A | 2/2000 |
| JP | 2000-132389 A | 5/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2004-318940 A | 11/2004 |
| JP | 2006-518053 | 8/2006 |
| JP | 2009-069960 A | 4/2009 |
| WO | WO-2004/059472 | 7/2004 |
| WO | WO-2004/114391 | 12/2004 |

OTHER PUBLICATIONS

Written Opinion (Application No. PCT/JP2012/062571) dated Jun. 12, 2012.

Fortunato.E et al., "Wide-Bandgap High-Mobility ZnO Thin-Film Transistors Produced at Room Temperature,", Appl. Phys. Lett. (Applied Physics Letters), Sep. 27, 2004, vol. 85, No. 13, pp. 2541-2543.

Dembo.H et al., "RFCPUS on Glass and Plastic Substrates Fabricated by TFT Transfer Technology,", IEDM 05: Technical Digest of International Electron Devices Meeting, Dec. 5, 2005, pp. 1067-1069.

Ikeda.T et al., "Full-Functional System Liquid Crystal Display Using CG-Silicon Technology,", SID Digest '04 : SID International symposium Digest of Technical Papers, 2004, vol. 35, pp. 860-863.

Nomura.K et al., "Room-Temperature Fabrication of Transparent Flexible Thin-Film Transistors Using Amorphous Oxide Semiconductors,", Nature, Nov. 25, 2004, vol. 432, pp. 488-492.

Park.J et al., "Improvements in the Device Characteristics of Amorphous Indium Gallium Zinc Oxide Thin-Film Transistors by Ar Plasma Treatment,", Appl. Phys. Lett. (Applied Physics Letters), Jun. 26, 2007, vol. 90, No. 26, pp. 262106-1-262106-3.

(56) References Cited

OTHER PUBLICATIONS

Takahashi.M et al., "Theoretical Analysis of IGZO Transparent Amorphous Oxide Semiconductor,", IDW'08 Proceedings of the 15th International Display Workshops, Dec. 3, 2008, pp. 1637-1640.

Hayashi.R et al., "42.1: Invited Paper: Improved Amorphous In—Ga—Zn—O TFTs,", SID Digest '08 : SID International Symposium Digest of Technical Papers, May 20, 2008, vol. 39, pp. 621-624.

Prins.M et al., "A Ferroelectric Transparent Thin-Film Transistor,", Appl. Phys. Lett. (Applied Physics Letters) , Jun. 17, 1996, vol. 68, No. 25, pp. 3650-3652.

Nakamura.M et al., "The phase relations in the In2O3—Ga2ZnO4—ZnO system at 1350° C.,", Journal of Solid State Chemistry, Aug. 1, 1991, vol. 93, No. 2, pp. 298-315.

Kimizuka.N. et al., "Syntheses and Single-Crystal Data of Homologous Compounds, In2O3(ZnO)m (m = 3, 4, and 5), InGaO3(ZnO)3 and Ga2O3(ZnO)m (m = 7, 8, 9, and 16) in the In2O3—ZnGa2O4—ZnO System,", Journal of Solid State Chemistry, Apr. 1, 1995, vol. 116, No. 1, pp. 170-178.

Nomura.K et al., "Thin-Film Transistor Fabricated in Single-Crystalline Transparent Oxide Semiconductor,", Science, May 23, 2003, vol. 300, No. 5623, pp. 1269-1272.

Masuda.S et al., "Transparent thin film transistors using ZnO as an active channel layer and their electrical properties,", J. Appl. Phys. (Journal of Applied Physics) , Feb. 1, 2003, vol. 93, No. 3, pp. 1624-1630.

Asakuma.N. et al., "Crystallization and Reduction of Sol-Gel-Derived Zinc Oxide Films by Irradiation With Ultraviolet Lamp,", Journal of Sol-Gel Science and Technology, 2003, vol. 26, pp. 181-184.

Osada.T at al., "15.2: Development of Driver-Integrated Panel using Amorphous In—Ga—Zn—Oxide TFT,", SID Digest '09 ; SID International Symposium Digest of Technical Papers, May 31, 2009, pp. 184-187.

Nomura.K et al., "Carrier transport in transparent oxide semiconductor with intrinsic structural randomness probed using single-cyrstalline InGaO3(ZnO)5 films,", Appl. Phys. Lett. (Applied Physics Letters) , Sep. 13, 2004, vol. 85, No. 11, pp. 1993-1995.

Li.C et al., "Modulated Structures of Homologous Compounds InMO3(ZnO)m (M=In,Ga; m=Integer) Described by Four-Dimensional Superspace Group,", Journal of Solid State chemistry, 1998, vol. 139, pp. 347-355.

Son.K et al., "42.4L: Late-News Paper: 4 Inch QVGA AMOLED Driven by the Threshold Voltage Controlled Amorphous GIZO (Ga2O3—In2O3—ZnO) TFT,", SID Digest '08 : SID International Symposium Digest of Technical Papers, May 20, 2008, vol. 39, pp. 633-636.

Lee.J et al., "World's Largest (15-Inch) XGA AMLCD Panel Using IGZO Oxide TFT,", SID Digest '08 : SID International Symposium Digest of Technical Papers, May 20, 2008, vol. 39, pp. 625-628.

Nowatari.H et al., "60.2: Intermediate Connector With Suppressed Voltage Loss for White Tandem OLEDS,", SID Digest '09 ; SID International Symposium Digest of Technical Papers, May 31, 2009, vol. 40, pp. 899-902.

Kanno.H et al., "White Stacked Electrophosphorecent Organic Light-Emitting Devices Employing MOO3 as a Charge-Generation Layer,", Adv. Mater. (Advanced Materials), 2006, vol. 18, No. 3, pp. 339-342.

Tsuda.K et al., "Ultra Low Power Consumption Technologies for Mobile TFT-LCDs ,", IDW '02 : Proceedings of the 9th International Display Workshops, Dec. 4, 2002, pp. 295-298.

Van de Walle.C, "Hydrogen as a Cause of Doping in Zinc Oxide,", Phys. Rev. Lett. (Physical Review Letters), Jul. 31, 2000, vol. 85, No. 5, pp. 1012-1015.

Fung.T et al., "2-D Numerical Simulation of High Performance Amorphous In—Ga—Zn—O TFTs for Flat Panel Displays,", AM-FPD '08 Digest of Technical Papers, Jul. 2, 2008, pp. 251-252, The Japan Society of Applied Physics.

Jeong.J et al., "3.1: Distinguished Paper: 12.1-Inch WXGA AMOLED Display Driven by Indium—Gallium—Zinc Oxide TFTs Array,", SID Digest '08 ; SID International Symposium Digest of Technical Papers, May 20, 2008, vol. 39, No. 1, pp. 1-4.

Park.J et al., "High performance amorphous oxide thin film transistors with self-aligned top-gate structure,", IEDM 09: Technical Digest of International Electron Devices Meeting, Dec. 7, 2009, pp. 191-194.

Kurokawa.Y et al., "UHF RFCPUS on Flexible and Glass Substrates for Secure RFID Systems,", Journal of Solid-State Circuits , 2008, vol. 43, No. 1, pp. 292-299.

Ohara.H et al., "Amorphous In—Ga—Zn—Oxide TFTs with Suppressed Variation for 4.0 inch QVGA AMOLED Display,", AM-FPD '09 Digest of Technical Papers, Jul. 1, 2009, pp. 227-230, The Japan Society of Applied Physics.

Coates.D et al., "Optical Studies of the Amorphous Liquid-Cholesteric Liquid Crystal Transition:The "Blue Phase",", Physics Letters, Sep. 10, 1973, vol. 45A, No. 2, pp. 115-116.

Cho.D et al., "21.2:Al and Sn-Doped Zinc Indium Oxide Thin Film Transistors for AMOLED Back-Plane,", SID Digest '09 : SID International Symposium Digest of Technical Papers, May 31, 2009, pp. 280-283.

Lee.M et al., "15.4:Excellent Performance of Indium—Oxide-Based Thin-Film Transistors by DC Sputtering,", SID Digest '09 : SID International Symposium Digest of Technical Papers, May 31, 2009, pp. 191-193.

Jin.D et al., "65.2:Distinguished Paper:World-Largest (6.5") Flexible Full Color Top Emission AMOLED Display on Plastic Film and its Bending Properties,", SID Digest '09 : SID International Symposium Digest of Technical Papers, May 31, 2009, pp. 983-985.

Sakata.J et al., "Development of 4.0-In. AMOLED Display With Driver Circuit Using Amorphous In—Ga—Zn—Oxide TFTs,", IDW '09 : Proceedings of the 16th International Display Workshops, 2009, pp. 689-692.

Park.J et al., "Amorphous Indium—Gallium—Zinc Oxide TFTs and Their Application for Large Size AMOLED,", AM-FPD '08 Digest of Technical Papers, Jul. 2, 2008, pp. 275-278.

Park.S et al., "Challenge to Future Displays: Transparent AM-OLED Driven by PEALD Grown ZnO TFT,", IMID '07 Digest, 2007, pp. 1249-1252.

Godo.H et al., "Temperature Dependence of Characteristics and Electronic Structure for Amorphous In—Ga—Zn—Oxide TFT,", AM-FPD '09 Digest of Technical Papers, Jul. 1, 2009, pp. 41-44.

Osada.T et al., "Development of Driver-Integrated Panel Using Amorphous In—Ga—Zn—Oxide TFT,", AM-FPD '09 Digest of Technical Papers, Jul. 1, 2009, pp. 33-36.

Hirao.T et al., "Novel Top-Gate Zinc Oxide Thin-Film Transistors (ZnO TFTs) for AMLCDS,", Journal of the SID, vol. 15, No. 1, pp. 17-22.

Hosono.H, "68.3:Invited Paper:Transparent Amorphous Oxide Semiconductors for High Performance TFT,", SID Digest '07 : SID International Symposium Digest of Technical Papers, 2007, vol. 38, pp. 1830-1833.

Godo.H et al., "P-9:Numerical Analysis on Temperature Dependence of Characteristics of Amorphous In—Ga—Zn—Oxide TFT,", SID Digest '09 : SID International Symposium Digest of Technical Papers, May 31, 2009, pp. 1110-1112.

Ohara.H et al., "21.3:4.0 In. QVGA AMOLED Display Using In—Ga—Zn—Oxide TFTs With a Novel Passivation Layer,", SID Digest '09 ; SID International Symposium Digest of Technical Papers, May 31, 2009, pp. 284-287.

Miyasaka.M, "SUFTLA Flexible Microelectronics on Their Way to Business,", SID Digest '07 ; SID International Symposium Digest of Technical Papers, 2007, vol. 38, pp. 1673-1676.

Chern.H et al., "An Analytical Model for the Above-Threshold Characteristics of Polysilicon Thin-Film Transistors,", IEEE Transactions on Electron Devices, Jul. 1, 1995, vol. 42, No. 7, pp. 1240-1246.

Kikuchi.H et al., "39.1:Invited Paper:Optically Isotropic Nano-Structured Liquid Crystal Composites for Display Applications,", SID Digest '09 : SID International Symposium Digest of Technical Papers, May 31, 2009, pp. 578-581.

Asaoka.Y et al., "29.1:Polarizer-Free Reflective LCD Combined With Ultra Low-Power Driving Technology,", SID Digest '09 : SID International Symposium Digest of Technical Papers, May 31, 2009, pp. 395-398.

(56) References Cited

OTHER PUBLICATIONS

Lee.H et al., "Current Status of, Challenges to, and Perspective View of AM-OLED ,", IDW '06 : Proceedings of the 13th International Display Workshops, Dec. 7, 2006, pp. 663-666.
Kikuchi.H et al., "62.2:Invited Paper:Fast Electro-Optical Switching in Polymer-Stabilized Liquid Crystalline Blue Phases for Display Application,", SID Digest '07 : SID International Symposium Digest of Technical Papers, 2007, vol. 38, pp. 1737-1740.
Nakamura.M, "Synthesis of Homologous Compound with New Long-Period Structure,", NIRIM Newsletter, Mar. 1, 1995, vol. 150, pp. 1-4.
Kikuchi.H et al., "Polymer-Stabilized Liquid Crystal Blue Phases,", Nature Materials, Sep. 2, 2002, vol. 1, pp. 64-68.
Kimizuka.N. et al., "Spinel,YBFE2O4, and YB2FE3O7 Types of Structures for Compounds in the In2O3 and Sc2O3—A2O3—BO Systems [A; Fe, Ga or Al; B: Mg, Mn, Fe, Ni, Cu or Zn]at Temperatures over 1000° C.,", Journal of Solid State Chemistry, 1985, vol. 60, pp. 382-384.
Kitzerow.H et al., "Observation of Blue Phases in Chiral Networks,", Liquid Crystals, 1993, vol. 14, No. 3, pp. 911-916.
Costello.M et al., "Electron Microscopy of a Cholesteric Liquid Crystal and Its Blue Phase,", Phys. Rev. A (Physical Review. A), May 1, 1984, vol. 29, No. 5, pp. 2957-2959.
Meiboom.S et al., "Theory of the Blue Phase of Cholesteric Liquid Crystals,", Phys. Rev. Lett. (Physical Review Letters), May 4, 1981, vol. 46, No. 18, pp. 1216-1219.
Park.Sang-Hee et al., "42.3: Transparent ZnO Thin Film Transistor for the Application of High Aperture Ratio Bottom Emission AM-OLED Display,", SID Digest '08 : SID International Symposium Digest of Technical Papers, May 20, 2008, vol. 39, pp. 629-632.
Orita.M et al., "Mechanism of Electrical Conductivity of Transparent InGaZnO4,", Phys. Rev. B (Physical Review. B), Jan. 15, 2000, vol. 61, No. 3, pp. 1811-1816.
Nomura.K et al., "Amorphous Oxide Semiconductors for High-Performance Flexible Thin-Film Transistors,", Jpn. J. Appl. Phys. (Japanese Journal of Applied Physics) , 2006, vol. 45, No. 5B, pp. 4303-4308.
Janotti.A et al., "Native Point Defects in ZnO,", Phys. Rev. B (Physical Review. B), Oct. 4, 2007, vol. 76, No. 16, pp. 165202-1-165202-22.
Park.J et al., "Electronic Transport Properties of Amorphous Indium—Gallium—Zinc Oxide Semiconductor Upon Exposure to Water,", Appl. Phys. Lett. (Applied Physics Letters) , 2008, vol. 92, pp. 072104-1-072104-3.
Hsieh.H et al., "P-29:Modeling of Amorphous Oxide Semiconductor Thin Film Transistors and Subgap Density of States,", SID Digest '08: SID International Symposium Digest of Technical Papers, 2008, vol. 39, pp. 1277-1280.
Janotti.A et al., "Oxygen Vacancies in ZnO,", Appl. Phys. Lett. (Applied Physics Letters) , 2005, vol. 87, pp. 122102-1-122102-3.
Oba.F et al., "Defect energetics in ZnO: A hybrid Hartree-Fock density functional study,", Phys. Rev. B. (Physical Review. B), 2008, vol. 77, pp. 245202-1-245202-6.
Orita.M et al., "Amorphous transparent conductive oxide InGaO3(ZnO)m (m<4):a Zn4s conductor,", Philosophical Magazine, 2001, vol. 81, No. 5, pp. 501-515.
Hosono.H et al., "Working hypothesis to explore novel wide band gap electrically conducting amorphous oxides and examples,", J. Non-Cryst. Solids (Journal of Non-Crystalline Solids), 1996, vol. 198-200, pp. 165-169.
Mo.Y et al., "Amorphous Oxide TFT Backplanes for Large Size AMOLED Displays,", IDW '08 : Proceedings of the 6th International Display Workshops, Dec. 3, 2008, pp. 581-584.
Kim.S et al., "High-Performance oxide thin film transistors passivated by various gas plasmas,", 214th ECS Meeting, 2008, No. 2317, ECS.
Clark.S et al., "First Principles Methods Using CASTEP,", Zeitschrift fur Kristallographie, 2005, vol. 220, pp. 567-570.
Lany.S et al., "Dopability, Intrinsic Conductivity, and Nonstoichiometry of Transparent Conducting Oxides,", Phys. Rev. Lett. (Physical Review Letters), Jan. 26, 2007, vol. 98, pp. 045501-1-045501-4.
Park.J et al., "Dry etching of ZnO films and plasma-induced damage to optical properties,", J. Vac. Sci. Technol. B (Journal of Vacuum Science & Technology B), Mar. 1, 2003, vol. 21, No. 2, pp. 800-803.
Oh.M et al., "Improving the Gate Stability of ZnO Thin-Film Transistors With Aluminum Oxide Dielectric Layers,", J. Electrochem. Soc. (Journal of the Electrochemical Society), 2008, vol. 155, No. 12, pp. H1009-H1014.
Ueno.K et al., "Field-Effect Transistor on SrTiO3 With Sputtered Al2O3 Gate Insulator,", Appl. Phys. Lett. (Applied Physics Letters) , Sep. 1, 2003, vol. 83, No. 9, pp. 1755-1757.

\* cited by examiner

- ● In
- ○ Sn
- ∘ Zn
- • O

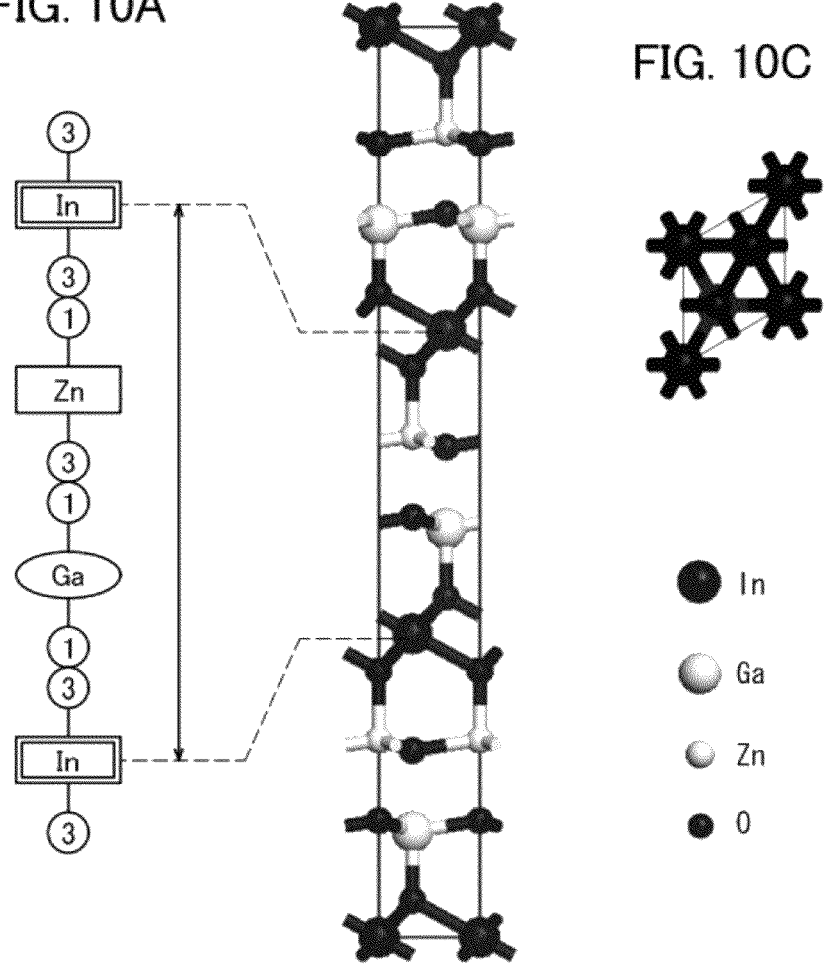

- In
- Ga or Zn
- O

- In
- Ga
- Zn
- O

SEMICONDUCTOR DEVICE AND METHOD FOR DRIVING THE SAME

TECHNICAL FIELD

The present invention relates to a semiconductor device and a driving method thereof. Specifically, the present invention relates to a semiconductor device which performs pipeline processing and a driving method thereof. Note that in this specification, semiconductor devices mean all devices utilizing semiconductor properties.

BACKGROUND ART

In many large scale integration (LSI) circuits and central processing units (CPUs), high-speed operation of circuits is achieved by pipeline processing. Note that in pipeline processing, a circuit is divided into a plurality of processing units connected in series and the plurality of processing units concurrently perform processing in accordance with instructions. One of the plurality of processing units outputs an instruction which has been processed to a processing unit in the next stage after the processing, and a new instruction from a processing unit in the previous stage is input to the one of the plurality of processing units. In this manner, the processing units can efficiently operate.

However, in pipeline processing, operation of the plurality of processing units is suspended (also referred to as a pipeline hazard or hazard) in some cases. For example, a hazard can occur in the case where a conditional branch instruction is input to the plurality of processing units. Note that a conditional branch instruction is an instruction by which a branch occurs if a condition is satisfied. In this case, whether or not the branch occurs is not known before an operation of a processing unit (also referred to as an arithmetic portion) that judges whether or not the condition is satisfied. Therefore, until whether or not the branch occurs is known, operation of a processing unit (also referred to as a reading portion) that reads (fetches) an instruction needs to be suspended, which causes delay in circuit operation.

In view of that fact, there is a known technique (branch prediction) in which prediction of whether or not a branch occurs allows a reading portion to keep operating even before whether or not the branch occurs is known (for example, see Patent Document 1). In this manner, the circuit can operate without delay in the case where the prediction is right.

REFERENCE

Patent Document

[Patent Document 1] Japanese Published Patent Application No. 2009-69960

DISCLOSURE OF INVENTION

However, in the case where the branch prediction turns out to be wrong, an existing instruction in the reading portion needs to be abandoned and a new instruction needs to be read. This causes operation delay which is as long as or longer than that in the case without the branch prediction.

Here, in the case where the new instruction is a subroutine, or the like, the instruction once abandoned in the reading portion is to be read again after the plurality of processing units perform processing in accordance with the subroutine or the like. In other words, the same operation is performed twice in the reading portion.

In view of the foregoing, an object of one embodiment of the present invention is to provide a semiconductor device in which redundant operations in a reading portion can be eliminated and operation delay can be reduced.

In a semiconductor device of one embodiment of the present invention, a reading portion includes a flip-flop which reads and holds an instruction and a memory which transmits and receives the instruction to and from the flip-flop. Further, transmission and reception of the instruction between the flip-flop and the memory are controlled with a signal output by an arithmetic portion which operates in accordance with the instruction read by the reading portion.

Specifically, one embodiment of the present invention is a semiconductor device which performs pipeline processing using a reading portion reading an instruction and an arithmetic portion performing an operation in accordance with the instruction. The reading portion includes a flip-flop reading and holding the instruction and a memory transmitting and receiving the instruction to and from the flip-flop. Transmission and reception of the instruction between the flip-flop and the memory are controlled with a signal output by the arithmetic portion.

In the semiconductor device of one embodiment of the present invention, transmission and reception of an instruction between the flip-flop and the memory which are included in the reading portion can be controlled by the arithmetic portion. Therefore, even in the case where the branch prediction turns out to be wrong, the existing instruction in the reading portion can be held, not abandoned. Specifically, the arithmetic portion transfers data which is held in the flip-flop to the memory, whereby the existing instruction can be held.

Further, after the arithmetic portion operates in accordance with an instruction read in the reading portion, the arithmetic portion can operate in accordance with the existing instruction without an operation of reading the existing instruction again. Specifically, the arithmetic portion transfers the data held in the memory to the flip-flop, so that the existing instruction can be output from the reading portion to the arithmetic portion.

Accordingly, in the semiconductor device of one embodiment of the present invention, it is possible to eliminate redundant operations which occur in the case where the instruction read by the reading portion after the branch prediction turns out to be wrong is a subroutine, or the like. Thus, operation delay of the semiconductor device can be reduced.

BRIEF DESCRIPTION OF DRAWINGS

In the accompanying drawings:

FIGS. 10A to 10C illustrate a crystal structure of an oxide semiconductor;

BEST MODE FOR CARRYING OUT THE INVENTION

An embodiment of the present invention will now be described in detail with reference to the accompanying drawings. Note that the invention is not limited to the description given below, and various changes and modifications can be made without departing from the spirit and scope of the invention. Therefore, the invention should not be construed as being limited to the description below.

First, an example of the semiconductor device of one embodiment of the present invention is described with reference to FIGS. 1A and 1B and FIGS. 2A and 2B.

Example of Structure of Semiconductor Device

Figure 1A:
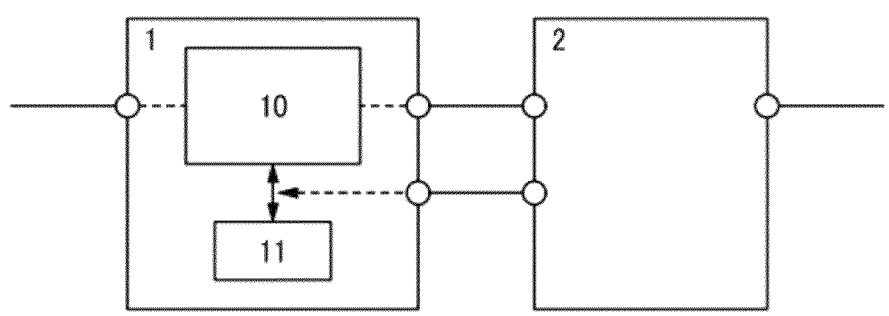
FIGS. 1A and 1B each illustrate an example of a structure of a semiconductor device.

FIG. 1A illustrates an example of a structure of a semiconductor device of one embodiment of the present invention. A semiconductor device illustrated in FIG. 1A includes a reading portion 1 and an arithmetic portion 2 which are connected in series. The reading portion 1 reads (fetches) an instruction from the outside (e.g., a cache) and outputs the instruction to the arithmetic portion 2. The arithmetic portion 2 performs an operation in accordance with the instruction input from the reading portion 1. Note that the reading portion 1 reads a new instruction from the outside in a period during which the arithmetic portion 2 performs the operation. That is, the semiconductor device illustrated in FIG. 1A is a semiconductor device which performs pipeline processing using the reading portion 1 and the arithmetic portion 2.

Note that in FIG. 1A, processing units other than the reading portion 1 and the arithmetic portion 2 may be connected in series to the reading portion 1 and the arithmetic portion 2. Further, the processing unit may be connected between the reading portion 1 and the arithmetic portion 2.

The reading portion 1 includes a flip-flop 10 reading an instruction from the outside and holding the instruction and a memory 11 transmitting and receiving the instruction to and from the flip-flop 10. Note that transmission and reception of the instruction between the flip-flop 10 and the memory 11 are controlled with a signal which is output by the arithmetic portion 2.

Therefore, in the semiconductor device illustrated in FIG. 1A, an instruction (an existing instruction) held in the flip-flop 10 can be transmitted to the memory 11 in response to a signal output by the arithmetic portion 2. Further, a new instruction can be read in the flip-flop 10. In other words, in the semiconductor device illustrated in FIG. 1A, the reading portion 1 can hold both the existing instruction and the new instruction. Note that the existing instruction can be transmitted back from the memory 11 to the flip-flop 10 with a signal output by the arithmetic portion 2.

In the semiconductor device illustrated in FIG. 1A, operation delay can be reduced which is caused in the case where an instruction read in the reading portion 1 after branch prediction turns out to be wrong is a subroutine, or the like. Specifically, first, the reading portion 1 reads a first instruction based on branch prediction. Here, in the case where the branch prediction turns out to be wrong by an operation which is performed by the arithmetic portion 2 concurrently with the reading operation of the reading portion 1, in the semiconductor device illustrated in FIG. 1A, the first instruction can be held in the memory 11, not abandoned. Then, in the semiconductor device illustrated in FIG. 1A, a second instruction is read with the use of the flip-flop 10. After that, the arithmetic portion 2 operates in accordance with the second instruction. Here, in the case where the second instruction is a subroutine, the arithmetic portion 2 is to subsequently perform an operation in accordance with the first instruction that is held in the memory 11. The semiconductor device illustrated in FIG. 1A does not need an operation of reading the first instruction again in that case. Accordingly, operation delay in the semiconductor device can be reduced.

Figure 1B:
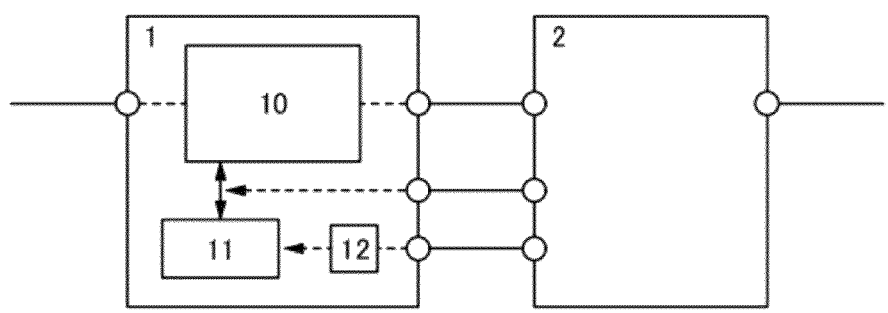

Further, as the semiconductor device, a semiconductor device illustrated in FIG. 1B can be used. The semiconductor device illustrated in FIG. 1B has a structure in which the reading portion 1 of the semiconductor device illustrated in FIG. 1A is additionally provided with a correction portion 12 that corrects an instruction held in the memory 11 in response to a signal output by the arithmetic portion 2. The correction portion 12 can correct the instruction even in the case where correction of the instruction becomes necessary as a result of an operation performed by the arithmetic portion 2 in a period during which the instruction is held in the memory 11. Note that in FIG. 1B, an example in which the instruction held in the memory 11 is corrected is illustrated; correction of the instruction by the correction portion 12 can be performed when the instruction is transmitted back from the memory 11 to the flip-flop 10.

Example of Structure of Memory

Figure 2A:
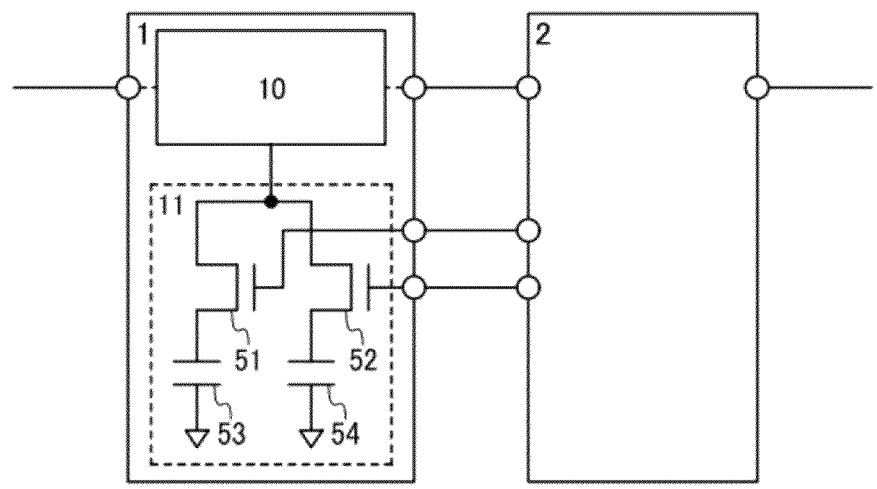
FIGS. 2A and 2B each illustrate an example of a structure of a memory.

FIG. 2A illustrates an example of a structure of the memory 11 included in the semiconductor devices illustrated in FIGS. 1A and 1B. The memory 11 illustrated in FIG. 2A includes a transistor 51, a transistor 52, a capacitor 53, and a capacitor 54. A gate of the transistor 51 is electrically connected to the arithmetic portion 2 and one of a source and a drain of the transistor 51 is electrically connected to the flip-flop 10. A gate of the transistor 52 is electrically connected to the arithmetic portion 2 and one of a source and a drain of the transistor 52 is electrically connected to the flip-flop 10. One electrode of the capacitor 53 is electrically connected to the other of the source and the drain of the transistor 51 and the other electrode of the capacitor 53 is electrically connected to a wiring supplying a fixed potential. One electrode of the capacitor 54 is electrically connected to the other of the source and the drain of the transistor 52 and the other electrode of the capacitor 54 is electrically connected to a wiring supplying a fixed potential. Note that the gate of the transistor 51 and the gate of the transistor 52 are electrically connected to respective nodes in the arithmetic portion 2. One of the source and the drain of the transistor 51 and one of the source and the drain of the transistor 52 are electrically connected to the same node in the flip-flop 10. Further, as the fixed potential, a ground potential or the like can be used.

Here, the transistor 51 and the transistor 52 illustrated in FIG. 2A are each a transistor whose channel is formed in an oxide semiconductor film. Since an oxide semiconductor has a wide bandgap and low intrinsic carrier density, an off-state current generated in the oxide semiconductor film can be extremely low. Note that details of the transistor whose channel is formed in the oxide semiconductor film will be described later. Accordingly, in the memory 11 illustrated in FIG. 2A, binary data can be held for a long time in a node where the other of the source and the drain of the transistor 51 and one electrode of the capacitor 53 are electrically connected to each other and a node where the other of the source and the drain of the transistor 52 and one electrode of the capacitor 54 are electrically connected to each other. Further, in the semiconductor device illustrated in FIG. 2A, switching of the transistor 51 and the transistor 52 is controlled in response to a signal output by the arithmetic portion 2, whereby an instruction held in the flip-flop 10 or part of the instruction can be held as binary data in the nodes.

Figure 2B:
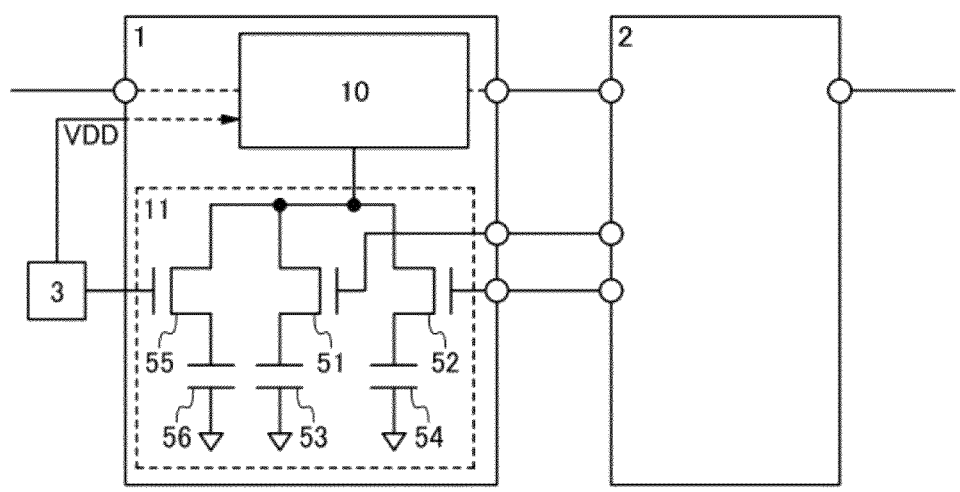

Note that as the memory 11 included in the semiconductor devices illustrated in FIGS. 1A and 1B, the memory 11 illustrated in FIG. 2B can be used. The memory 11 illustrated in FIG. 2B has the structure of the memory 11 illustrated in the FIG. 2A to which a transistor 55 and a capacitor 56 are added. A gate of the transistor 55 is electrically connected to a power supply control portion 3 and one of a source and a drain of the transistor 55 is electrically connected to the flip-flop 10. One electrode of the capacitor 56 is electrically connected to the other of the source and the drain of the transistor 55 and the other electrode of the capacitor 56 is electrically connected to a wiring supplying a fixed potential. Note that the power supply control portion 3 has a function of determining whether or not a power supply voltage VDD is supplied to the flip-flop 10. Further, the transistor 55 is a transistor whose channel is formed in an oxide semiconductor film. Accordingly, the instruction held in the flip-flop 10 or part of the instruction can be held as binary data in a node where the other of the source and the drain of the transistor 55 and one electrode of the capacitor 56 are electrically connected to each other.

In the semiconductor device illustrated in FIG. 2B, the transistor 55 is in an on state before and after a period during which supply of the power supply voltage VDD to the flip-flop 10 is suspended by the power supply control portion 3, and the transistor 55 is in an off state during the period, whereby the instruction held in the flip-flop 10 can be held in the memory 11 during the period. Thus, the suspension of supply of the power supply voltage VDD to the flip-flop 10 allows power consumption to be reduced and operation delay can be reduced. Note that in the memory 11 illustrated in FIG. 2B, there is a high probability that a period during which the transistor 55 remains in an off state is longer than a period during which the transistor 51 or the transistor 52 remains in an off state. Thus, the capacitor 56 preferably has a larger capacitance value than each of the capacitor 53 and the capacitor 54.

Example of Structure of Transistor

The above-described semiconductor device includes a number of transistors. A specific example of the transistor included in the semiconductor device is described below. Note that examples of structures and manufacturing processes of a p-channel transistor and an n-channel transistor which are included in the flip-flop 10 and a transistor in which a channel is formed in an oxide semiconductor film and which is included in the memory 11 are described with reference to FIGS. 3A to 3E, FIGS. 4A to 4D, FIGS. 5A to 5D, and FIGS. 6A and 6B. Specifically, in each of the cross-sectional views of FIGS. 3A to 3E, FIGS. 4A to 4D, FIGS. 5A to 5D, and FIGS. 6A and 6B, a cross section along line A1-A2 illustrates a manufacturing step of the n-channel transistor and a cross section along line B1-B2 illustrates a manufacturing step of the p-channel transistor.

Figure 3A:
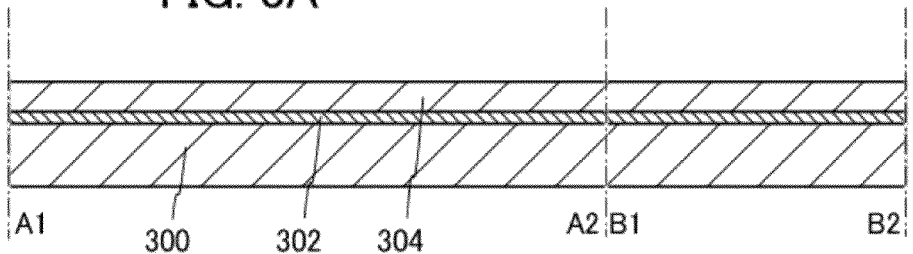
FIGS. 3A to 3E are cross-sectional views illustrating an example of a manufacturing process of a transistor.

First, a substrate 300 over which a semiconductor film 304 is provided with an insulating film 302 interposed therebetween is prepared (see FIG. 3A).

As the substrate 300, for example, a single crystal semiconductor substrate or a polycrystalline semiconductor substrate containing silicon, silicon carbide, or the like, or a compound semiconductor substrate containing silicon germanium, gallium arsenide, indium phosphide, or the like can be used. Specific examples thereof are a variety of glass substrates that are used in the electronics industry, such as substrates of aluminosilicate glass, aluminoborosilicate glass, and barium borosilicate glass, a quartz substrate, a ceramic substrate, and a sapphire substrate.

The insulating film 302 is formed to have a single-layer structure or a stacked-layer structure using silicon oxide, silicon oxynitride, silicon nitride, or the like. As a formation method of the insulating film 302, a thermal oxidation method, a CVD method, a sputtering method, or the like can be used. The thickness of the insulating film 302 is greater than or equal to 1 nm and less than or equal to 100 nm, preferably greater than or equal to 10 nm and less than or equal to 50 nm.

As the semiconductor film 304, a single crystal semiconductor material or a polycrystalline semiconductor material of silicon, silicon carbide, or the like, or a compound semiconductor material of silicon germanium, gallium arsenide, indium phosphide, or the like can be used. Since the semiconductor film 304 does not include an oxide semiconductor material, the semiconductor film 304 is also referred to as a semiconductor material other than an oxide semiconductor.

As the semiconductor film 304, a single crystal semiconductor material of silicon or the like is preferably used because in that case, the flip-flop 10 can operate at higher speed.

Alternatively, an SOI substrate can be used as the substrate 300 over which the semiconductor film 304 is formed with the insulating film 302 interposed therebetween. Note that although the term "SOI substrate" generally means a substrate in which a silicon layer is provided on an insulating surface, the term "SOI substrate" in this specification and the like also includes a substrate in which a semiconductor film including a material other than silicon is provided on an insulating surface. That is, the semiconductor film included in the "SOI substrate" is not limited to a silicon layer. Moreover, the SOI substrate also includes a substrate having a structure in which a semiconductor film is provided over an insulating substrate such as a glass substrate with an insulating film interposed therebetween. Here, the case is described in which an SOI substrate in which a silicon film is provided over a single crystal silicon substrate with a silicon oxide film interposed therebetween is used as the substrate 300 over which the semiconductor film 304 is formed with the insulating film 302 interposed therebetween.

Figure 3B:
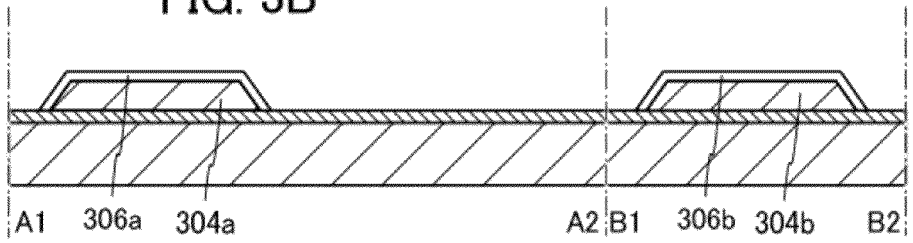

Next, the semiconductor film 304 is processed into an island shape, so that semiconductor films 304a and 304b are formed (see FIG. 3B). For the processing, dry etching is preferably performed, but wet etching may be performed. An etching gas and an etchant can be selected as appropriate depending on a material to be etched.

Next, gate insulating films 306a and 306b are formed so as to cover the semiconductor films 304a and 304b (see FIG. 3B). The gate insulating films 306a and 306b can be formed, for example, by performing heat treatment (e.g., thermal oxidation treatment, thermal nitridation treatment, or the like) on surfaces of the semiconductor films 304a and 304b. High-density plasma treatment may be employed instead of heat treatment. The high-density plasma treatment can be performed using, for example, a mixed gas of a rare gas such as He, Ar, Kr, or Xe and any of oxygen, nitrogen oxide, ammonia, nitrogen, and hydrogen. Needless to say, the gate insulating films may be formed by a CVD method, a sputtering method, or the like.

The gate insulating films 306a and 306b can be formed using silicon oxide, silicon oxynitride, silicon nitride, hafnium oxide, aluminum oxide, tantalum oxide, or the like. Alternatively, the gate insulating films can be formed using a material with a high dielectric constant (a high-k material) such as hafnium oxide, yttrium oxide, hafnium silicate (Hf-$Si_xO_y$ (x>0, y>0)), hafnium silicate to which nitrogen is added ($HfSi_xO_yN_z$ (x>0, y>0, z>0)), or hafnium aluminate to which nitrogen is added ($HfAl_xO_yN_z$ (x>0, y>0, z>0)). The gate insulating films are formed to have a single-layer structure or a stacked-layer structure using any of the above materials. The thickness of each of the gate insulating films 306a and 306b can be, for example, greater than or equal to 1 nm and less than or equal to 100 nm, preferably greater than or equal to 10 nm and less than or equal to 50 nm.

When the gate insulating films are thin as in the above description, a problem of gate leakage due to a tunneling effect or the like is caused. In order to solve the problem of gate leakage, the above high-k material is preferably used for the gate insulating films. With the use of a high-k material for the gate insulating films, the thickness of each of the gate insulating films can be increased to prevent gate leakage and electrical characteristics can be maintained. Note that a stacked-layer structure of a film including a high-k material and a film containing any of silicon oxide, silicon nitride, silicon oxynitride, silicon nitride oxide, aluminum oxide, and the like may be employed.

Figure 3C:
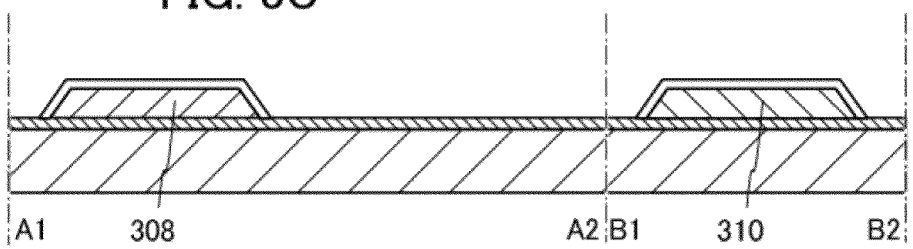

Next, an impurity element imparting n-type conductivity and an impurity element imparting p-type conductivity are added to the semiconductor films 304a and 304b through the gate insulating films 306a and 306b in order to control the threshold voltages of the transistors (see FIG. 3C). In the case where silicon is used for the semiconductor films 304a and 304b, for example, phosphorus, arsenic, or the like can be used as an impurity element imparting n-type conductivity. On the other hand, boron, aluminum, gallium, or the like can be used as an impurity element imparting p-type conductivity. Here, boron is added to the semiconductor film 304a through the gate insulating film 306a, so that a semiconductor film 308 containing an impurity is formed, and phosphorus is added to the semiconductor film 304b through the gate insulating film 306b, so that a semiconductor film 310 containing an impurity is formed.

Figure 3D:
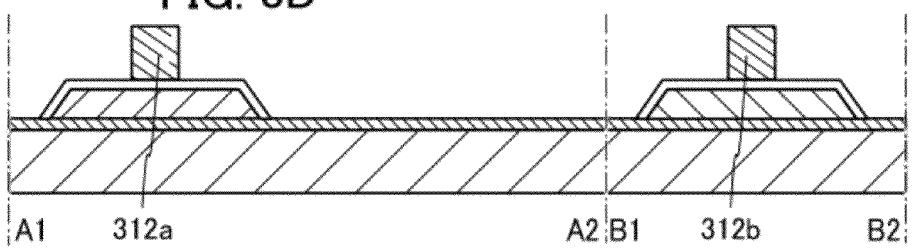

Next, a conductive film used for forming a gate electrode (including a wiring formed using the same layer as the gate electrode) is formed over the gate insulating films 306a and 306b and is processed, so that gate electrodes 312a and 312b are formed (see FIG. 3D).

The conductive film used for the gate electrodes 312a and 312b can be formed using a metal material such as aluminum, copper, titanium, tantalum, or tungsten. The conductive film may be formed using a semiconductor material such as polycrystalline silicon. There is no particular limitation on the method for forming the conductive film, and a variety of film formation methods such as an evaporation method, a CVD method, a sputtering method, and a spin coating method can be employed. The conductive film can be processed by etching with the use of a resist mask.

Figure 3E:
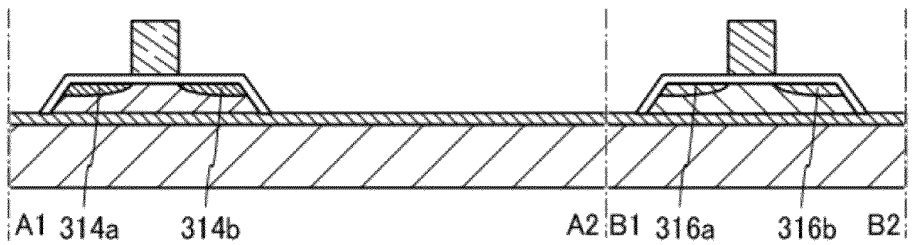

Next, an impurity element imparting n-type conductivity and an impurity element imparting p-type conductivity are added to the semiconductor films 304a and 304b using the gate electrodes 312a and 312b as masks through the gate insulating films 306a and 306b (see FIG. 3E). Here, phosphorus is added to the semiconductor film 304a through the gate insulating film 306a, so that impurity regions 314a and 314b are formed, and boron is added to the semiconductor film 304b through the gate insulating film 306b, so that impurity regions 316a and 316b are formed.

Figure 4A:
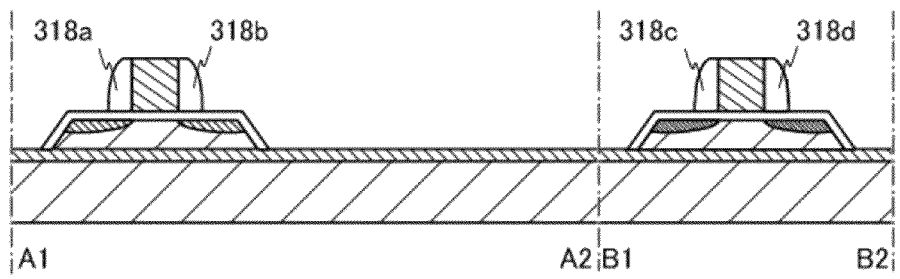
FIGS. 4A to 4D are cross-sectional views illustrating an example of a manufacturing process of a transistor.
Figure 4B:
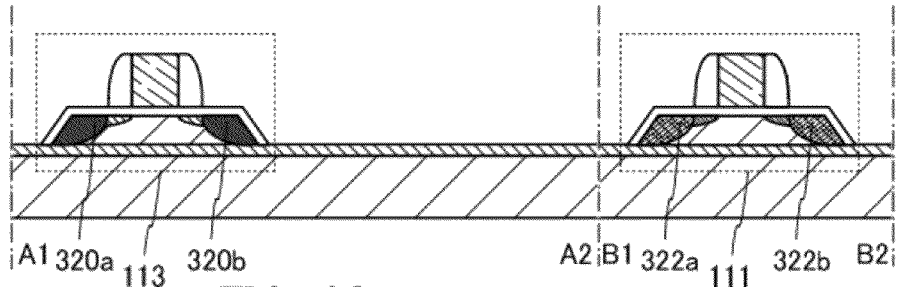

Next, sidewall insulating films 318a to 318d having a sidewall structure are formed on side surfaces of the gate electrodes 312a and 312b (see FIG. 4A). The sidewall insulating films 318a to 318d are formed in such a manner that an insulating film that covers the gate electrodes 312a and 312b is formed and then processed by anisotropic etching by a reactive ion etching (RIE) method. There is no particular limitation on the insulating film; for example, the insulating film can be formed using silicon oxide with favorable step coverage, which is formed by reaction of tetraethyl orthosilicate (TEOS), silane, or the like with oxygen, nitrous oxide, or the like. The insulating film may be formed using silicon oxide formed by a low temperature oxidation (LTO) method. The insulating film can be formed by a thermal CVD method, a plasma CVD method, an atmospheric pressure CVD method, a bias ECRCVD method, a sputtering method, or the like.

Next, an impurity element imparting n-type conductivity and an impurity element imparting p-type conductivity are added to the semiconductor films 304a and 304b using the gate electrodes 312a and 312b and the sidewall insulating films 318a to 318d as masks through the gate insulating films 306a and 306b. Here, phosphorus is added to the semiconductor film 304a through the gate insulating film 306a, so that impurity regions 320a and 320b are formed, and boron is added to the semiconductor film 304b through the gate insulating film 306b, so that impurity regions 322a and 322b are formed (see FIG. 4B).

Through the above steps, an n-channel transistor 113 and a p-channel transistor 111 can be manufactured using the substrate 300 over which a semiconductor material other than an oxide semiconductor is provided. Such transistors are capable of high-speed operation.

Figure 4C:
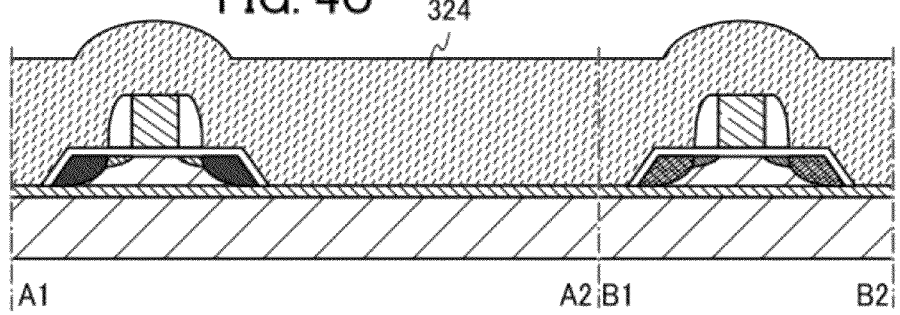

Next, an insulating film 324 is formed so as to cover the transistor 113 and the transistor 111 (see FIG. 4C). The insulating film 324 can be formed using a material containing an inorganic insulating material such as silicon oxide, silicon oxynitride, silicon nitride, or aluminum oxide. A material with a low dielectric constant (a low-k material) is preferably used for the insulating film 324 because capacitance due to overlap of electrodes or wirings can be sufficiently reduced. Note that a porous insulating film formed using such a material may be used as the insulating film 324. The porous insulating film has a lower dielectric constant than an insulating film with high density and thus makes it possible to further reduce capacitance due to electrodes or wirings. Alternatively, the insulating film 324 can be formed using an organic insulating material such as polyimide or acrylic. Here, the case where the insulating film 324 is formed using silicon oxynitride is described.

Next, heat treatment is performed to activate the impurity elements added to the semiconductor films 304a and 304b. The heat treatment is performed using an annealing furnace. Alternatively, a laser annealing method or a rapid thermal annealing (RTA) method can be used. The heat treatment is performed at 400° C. to 600° C., typically 450° C. to 500° C. in a nitrogen atmosphere for 1 to 4 hours. By this heat treatment, activation of the impurity elements is performed and hydrogen in the silicon oxynitride film of the insulating film 324 is released, so that hydrogenation of the semiconductor films 304a and 304b can be performed.

Note that before or after each of the above steps, a step of forming an electrode, a wiring, a semiconductor film, an insulating film, or the like may be further performed. For example, an electrode, a wiring, or the like for connecting the transistor in the lower portion and the transistor in the upper portion is preferably formed. In addition, a multilayer wiring structure in which an insulating film and a conductive layer are stacked may be employed as a wiring structure, so that a highly-integrated memory device can be achieved.

Figure 4D:
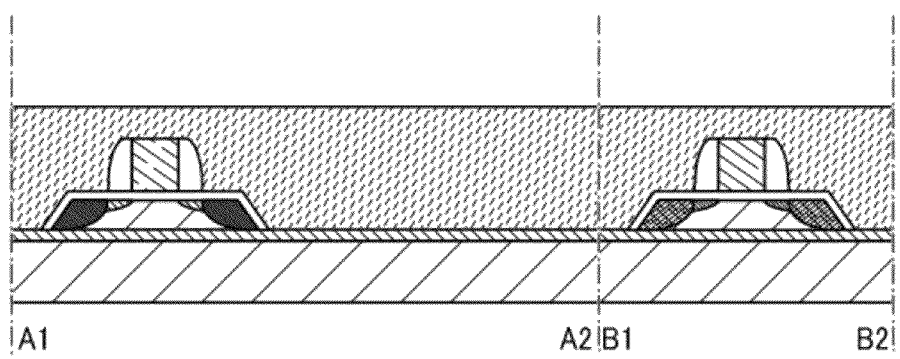

Then, a surface of the insulating film 324 is planarized (see FIG. 4D). As the planarization treatment for the insulating film 324, polishing treatment such as chemical mechanical polishing (hereinafter, also referred to as CMP treatment), etching treatment or the like can be employed.

Here, CMP treatment is a method of planarizing a surface of an object to be processed with a combination of chemical and mechanical actions, using the surface as a reference. Specifically, CMP treatment is a method in which a polishing cloth is attached to a polishing stage, the polishing stage and an object to be processed are rotated or swung while a slurry (an abrasive) is supplied between the object and the polishing cloth, and the surface of the object is polished by a chemical reaction between the slurry and the object and by action of mechanical polishing of the object with the polishing cloth.

It is preferable that the CMP treatment be performed such that the surface of the insulating film 324 has an average surface roughness ($R_a$) of less than or equal to 1 nm, preferably less than or equal to 0.3 nm, more preferably less than or equal to 0.1 nm. Note that $R_a$ is obtained by three-dimension expansion of center line average surface roughness which is defined by JIS B 0601 so as to be applied to a plane. The $R_a$ can be expressed as an "average value of the absolute values of deviations from a reference surface to a specific surface" and is defined by the following formula (1).

[FORMULA 1]

$$Ra = \frac{1}{S_0} \int_{x_1}^{x_2} \int_{y_1}^{y_2} |f(x, y) - Z_0| dx dy \quad (1)$$

In the above formula, $S_0$ represents the area of a plane to be measured (a quadrangular region which is defined by four points represented by coordinates $(x_1, y_1)$, $(x_1, y_2)$, $(x_2, y_1)$, and $(x_2, y_2)$), and $Z_0$ represents the average height of the plane to be measured. Further, $R_a$ can be measured using an atomic force microscope (AFM).

Figure 5A:
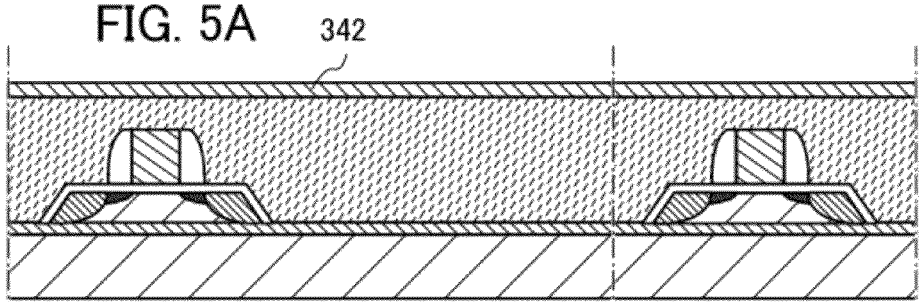
FIGS. 5A to 5D are cross-sectional views illustrating an example of a manufacturing process of a transistor.

Next, an oxide semiconductor film 342 is formed over the planarized surface of the insulating film 324 (see FIG. 5A).

An oxide semiconductor to be used preferably contains at least indium (In) or zinc (Zn). In particular, In and Zn are preferably contained. As a stabilizer for reducing variation in electrical characteristics of a transistor including the oxide semiconductor, gallium (Ga) is preferably additionally contained. Tin (Sn) is preferably contained as a stabilizer. Hafnium (Hf) is preferably contained as a stabilizer. Aluminum (Al) is preferably contained as a stabilizer.

As another stabilizer, one or plural kinds of lanthanoid such as lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), or lutetium (Lu) may be contained.

As the oxide semiconductor, for example, indium oxide, tin oxide, zinc oxide, a two-component metal oxide such as an In—Zn-based oxide, a Sn—Zn-based oxide, an Al—Zn-based oxide, a Zn—Mg-based oxide, a Sn—Mg-based oxide, an In—Mg-based oxide, or an In—Ga-based oxide, a three-component metal oxide such as an In—Ga—Zn-based oxide (also referred to as IGZO), an In—Al—Zn-based oxide, an In—Sn—Zn-based oxide, a Sn—Ga—Zn-based oxide, an Al—Ga—Zn-based oxide, a Sn—Al—Zn-based oxide, an In—Hf—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, or an In—Lu—Zn-based oxide, a four-component metal oxide such as an In—Sn—Ga—Zn-based oxide, an In—Hf—Ga—Zn-based oxide, an In—Al—Ga—Zn-based oxide, an In—Sn—Al—Zn-based oxide, an In—Sn—Hf—Zn-based oxide, or an In—Hf—Al—Zn-based oxide can be used.

Note that here, for example, an In—Ga—Zn-based oxide means an oxide containing In, Ga, and Zn as its main component, and there is no limitation on the ratio of In:Ga:Zn. Further, the In—Ga—Zn-based oxide may contain a metal element other than In, Ga, and Zn.

For example, an In—Ga—Zn-based oxide with an atomic ratio of In:Ga:Zn=1:1:1 (=1/3:1/3:1/3) or In:Ga:Zn=2:2:1 (=2/5:2/5:1/5), or any of oxides whose composition is in the neighborhood of the above compositions can be used. Alternatively, an In—Sn—Zn-based oxide with an atomic ratio of In:Sn:Zn=1:1:1 (=1/3:1/3:1/3), In:Sn:Zn=2:1:3 (=1/3:1/6:1/2), or In:Sn:Zn=2:1:5 (=1/4:1/8:5/8), or any of oxides whose composition is in the neighborhood of the above compositions may be used.

However, the composition is not limited to those described above, and a material having an appropriate composition may be used depending on needed semiconductor characteristics (such as mobility, threshold voltage, and variation). In order to obtain needed semiconductor characteristics, it is preferable that the carrier density, the impurity concentration, the defect density, the atomic ratio of a metal element to oxygen, the interatomic distance, the density, and the like be set to appropriate values.

For example, it is relatively easy to obtain high mobility with an In—Sn—Zn-based oxide. However, it is possible to obtain high mobility even with an In—Ga—Zn-based oxide by reducing the defect density in a bulk.

Note that for example, the expression "the composition of an oxide containing In, Ga, and Zn at the atomic ratio, In:Ga:Zn=a:b:c (a+b+c=1), is in the neighborhood of the composition of an oxide containing In, Ga, and Zn at the atomic ratio, In:Ga:Zn=A:B:C (A+B+C=1)" means that a, b, and c satisfy the following relation: $(a-A)^2 + (b-B)^2 + (c-C)^2 \leq r^2$, and r may be 0.05, for example. The same applies to other oxides.

The oxide semiconductor may be either single crystal or non-single-crystal. In the latter case, the oxide semiconductor may be either amorphous or polycrystalline. Further, the oxide semiconductor may have either an amorphous structure including a portion having crystallinity or a non-amorphous structure.

In an oxide semiconductor in an amorphous state, a flat surface can be obtained with relative ease, so that when a transistor is manufactured with the use of the oxide semiconductor, interface scattering can be reduced, and relatively high mobility can be obtained with relative ease.

In an oxide semiconductor having crystallinity, defects in a bulk can be further reduced and when a surface flatness is improved, and mobility higher than that of an oxide semiconductor in an amorphous state can be obtained. In order to improve the surface flatness, the oxide semiconductor is preferably formed over a flat surface. Specifically, the oxide semiconductor may be formed over a surface with the average surface roughness ($R_a$) of less than or equal to 1 nm, preferably less than or equal to 0.3 nm, more preferably less than or equal to 0.1 nm.

In the case where an In—Zn—O-based material is used as the oxide semiconductor film 342, the atomic ratio of metal elements in a target is In:Zn=50:1 to 1:2 in atomic ratio ($In_2O_3$:ZnO=25:1 to 1:4 in molar ratio), preferably, In:Zn=20:1 to 1:1 in atomic ratio ($In_2O_3$:ZnO=10:1 to 1:2 in molar ratio), further preferably, In:Zn=15:1 to 1.5:1 in atomic ratio ($In_2O_3$:ZnO=15:2 to 3:4 in molar ratio). For example, in a target used for formation of an In—Zn—O-based oxide semiconductor which has an atomic ratio of In:Zn:O=X:Y:Z, the relation of Z>1.5X+Y is satisfied.

In the case of forming the oxide semiconductor film 342 using an In—Ga—Zn—O-based material by a sputtering method, it is preferable to use an In—Ga—Zn—O target having an atomic ratio of In:Ga:Zn=1:1:1, 4:2:3, 3:1:2, 1:1:2, 2:1:3, or 3:1:4.

In the case of forming the oxide semiconductor film 342 using an In—Sn—Zn—O-based material by a sputtering method, it is preferable to use an In—Sn—Zn—O target having an atomic ratio of In:Sn:Zn=1:1:1, 2:1:3, 1:2:2, or 20:45:35.

The relative density of the target is higher than or equal to 90% and lower than or equal to 100%, preferably higher than or equal to 95% and lower than or equal to 99.9%. With the use of the target with high relative density, the oxide semiconductor film 342 can have high density.

The oxide semiconductor film 342 can be formed by a sputtering method, a molecular beam epitaxy method, an atomic layer deposition method, or a pulsed laser deposition method. The thickness of the oxide semiconductor film 342 is greater than or equal to 5 nm and less than or equal to 100 nm, preferably greater than or equal to 10 nm and less than or equal to 30 nm.

The oxide semiconductor film 342 may be amorphous or may have crystallinity. For example, the oxide semiconductor film can be a non-single-crystal film including a crystal which has a triangular, hexagonal, regular triangular, or regular hexagonal atomic arrangement when seen from the direction perpendicular to the a-b plane and in which metal atoms are arranged in a layered manner or metal atoms and oxygen atoms are arranged in a layered manner when seen from the direction perpendicular to the c-axis. Note that in this specification and the like, the film is called a c-axis aligned crystalline oxide semiconductor (CAAC-OS) film.

The CAAC-OS film is not a single crystal, but this does not mean that the CAAC-OS film is composed of only an amorphous component. Although the CAAC-OS film includes a crystallized portion (crystalline portion), a boundary between one crystalline portion and another crystalline portion is not clear in some cases.

Nitrogen may be substituted for part of oxygen included in the CAAC-OS film. The c-axes of individual crystalline portions included in the CAAC-OS film may be aligned in one direction (e.g., a direction perpendicular to a surface of a substrate over which the CAAC-OS film is formed or a surface of the CAAC-OS film). Alternatively, the normals of the a-b planes of the individual crystalline portions included in the CAAC-OS film may be aligned in one direction (e.g., a direction perpendicular to a surface of a substrate over which the CAAC-OS film is formed or a surface of the CAAC-OS film).

As an example of such a CAAC-OS film, there is an oxide film which is formed into a film shape and has a triangular or hexagonal atomic arrangement when observed from the direction perpendicular to a surface of the film or a surface of a substrate, and in which metal atoms are arranged in a layered manner or metal atoms and oxygen atoms (or nitrogen atoms) are arranged in a layered manner when a cross section of the film is observed.

Next, a formation method of the oxide semiconductor film 342 as a CAAC-OS film is described. As a formation method of the oxide semiconductor film 342 as a CAAC-OS film, the following two kinds of methods can be given, for example. One of the methods is that formation of the oxide semiconductor film 342 is performed while a substrate is heated; the other method is that formation of the oxide semiconductor film 342 is performed in two steps, and heat treatment is performed after each formation step of the oxide semiconductor film 342.

In the case where the oxide semiconductor film 342 is formed in one step while a substrate is heated, the substrate temperature may be higher than or equal to 100° C. and lower than or equal to 600° C., preferably higher than or equal to 200° C. and lower than or equal to 500° C. When the substrate is heated at high temperature during formation of the oxide semiconductor film 342, the CAAC-OS film in which the proportion of a crystalline portion is higher than that of an amorphous portion can be formed.

In the case where formation of the oxide semiconductor film 342 is performed in two steps, a first oxide semiconductor film 342 is formed over the insulating film 324 while the substrate temperature is kept at a temperature higher than or equal to 100° C. and lower than or equal to 450° C., and then heat treatment is performed at a temperature higher than or equal to 550° C. and lower than the strain point of the substrate under an atmosphere of nitrogen, oxygen, a rare gas, or dry air. By the heat treatment, a crystalline region (including a plate-like crystal) is formed in a region including a surface of the first oxide semiconductor film 342. Next, a second oxide semiconductor film 342 is formed thicker than the first oxide semiconductor film 342. After that, heat treatment is performed again at a temperature higher than or equal to 550° C. and lower than the strain point of the substrate, so that crystals grow upward using, as a seed of crystal growth, the first oxide semiconductor film 342 in which a crystalline region (including a plate-like crystal) is formed in the region including the surface. Thus, the second oxide semiconductor film 342 is entirely crystallized. Note that the thickness of the first oxide semiconductor film 342 is preferably greater than or equal to 1 nm and less than or equal to 10 nm.

The above formation method is preferable because a short-channel effect can be suppressed even when the thickness of the oxide semiconductor film 342 is approximately 5 nm.

Since the crystallinity of the CAAC-OS film is affected by roughness of a surface where the CAAC-OS film is formed, as described above, the surface of the insulating film 324 is preferably planarized as much as possible. The average surface roughness of the insulating film 324 is preferably greater than or equal to 0.1 nm and less than 0.5 nm. By planarizing the surface of the insulating film 324, the continuity of the crystal included in the CAAC-OS film can be improved. In addition, by planarizing the surface of the insulating film 324, the CAAC-OS film in which the proportion of a crystalline portion is higher than that of an amorphous portion can be formed.

The oxide semiconductor film 342 formed by a sputtering method contains hydrogen, water, a compound having a hydroxyl group, or the like in some cases. Hydrogen, water, and the like easily form a donor level and thus serve as impurities in the oxide semiconductor. Therefore, in the formation of the oxide semiconductor film 342 by a sputtering method, the hydrogen concentration in the oxide semiconductor film 342 is preferably reduced as much as possible.

In order to reduce the hydrogen concentration, the leakage rate of a treatment chamber of a sputtering apparatus is set to $1 \times 10^{-10}$ Pa·m$^3$/s or less in the formation of the oxide semiconductor film 342, whereby entry of impurities such as an alkali metal and hydride into the oxide semiconductor film 342 that is being deposited by a sputtering method can be reduced. Further, with the use of an entrapment vacuum pump (e.g., a cryopump) as an evacuation system, counter flow of impurities such as an alkali metal, a hydrogen atom, a hydrogen molecule, water, a compound having a hydroxyl group, and hydride from the evacuation system can be reduced.

When the purity of the target is set to 99.99% or higher, alkali metal, a hydrogen atom, a hydrogen molecule, water, a hydroxyl group, hydride, or the like mixed to the oxide semiconductor film can be reduced. In addition, when the target is used, the concentration of alkali metal such as lithium, sodium, or potassium can be reduced in the oxide semiconductor film.

A highly purified rare gas (typically, argon), highly purified oxygen, or a highly purified mixed gas of oxygen and a rare gas, from which impurities such as hydrogen, water, a compound having a hydroxyl group, and hydride are removed, is used as appropriate as an atmosphere gas supplied to a treatment chamber of a sputtering apparatus. For example, the purity of argon is set to 9N (99.9999999%) or higher (the concentration of $H_2O$ is less than 0.1 ppb, and the concentration of $H_2$ is less than 0.5 ppb), and the dew point thereof is set to $-121°$ C. The oxygen concentration is set to 8N (99.999999%) or higher (the concentration of $H_2O$ is less than 1 ppb, and the concentration of $H_2$ is less than 1 ppb), and the dew point thereof is set to $-112°$ C. In the case where a mixed gas of the rare gas and oxygen is used, the flow rate ratio of oxygen is preferably high.

As one example of the film formation condition, the distance between the substrate and the target is 100 mm, the pressure is 0.6 Pa, the direct-current (DC) power is 0.5 kW, and the atmosphere is an oxygen atmosphere (the proportion of the oxygen flow is 100%). Note that a pulsed direct-current (DC) power source is preferable because dust generated in film formation can be reduced and the film thickness can be made uniform.

In this manner, the oxide semiconductor film 342 in which the amount of contained hydrogen is small can be formed. Note that even when the sputtering apparatus is used, the oxide semiconductor film 342 contains more than a little nitrogen. For example, the nitrogen concentration in the oxide semiconductor film 342 measured by secondary ion mass spectrometry (SIMS) is lower than $5 \times 10^{18}$ atoms$^{-3}$.

In order to reduce impurities such as moisture and hydrogen in the oxide semiconductor film 342 (dehydration or dehydrogenation), the oxide semiconductor film 342 is preferably subjected to heat treatment. For example, the oxide semiconductor film 342 is subjected to heat treatment in a reduced-pressure atmosphere, an inert gas atmosphere of nitrogen, a rare gas, or the like, an oxidation atmosphere, or an ultra dry air atmosphere (the moisture amount is 20 ppm ($-55°$ C. by conversion into a dew point) or less, preferably 1 ppm or less, more preferably 10 ppb or less, in the case where the measurement is performed by a dew point meter in a cavity ring down laser spectroscopy (CRDS) system). Note that the oxidation atmosphere refers to an atmosphere including an oxidation gas such as oxygen, ozone, or nitrogen oxide (e.g., nitrous oxide or dinitrogen monoxide) at 10 ppm or higher. The inert gas atmosphere refers to an atmosphere including the oxidation gas at lower than 10 ppm and is filled with nitrogen or a rare gas.

For example, the heat treatment is performed at a temperature higher than or equal to 150° C. and lower than the strain point of the substrate, preferably higher than or equal to 250° C. and lower than or equal to 450° C., more preferably higher than or equal to 300° C. and lower than or equal to 450° C. The treatment time is 3 minutes to 24 hours. It is preferable that the heat treatment time be 24 hours or shorter in order not to reduce the productivity.

There is no particular limitation on a heat treatment apparatus used for the heat treatment, and the apparatus may be provided with a device for heating an object to be processed by heat radiation or heat conduction from a heating element such as a resistance heating element. For example, an electric furnace, or a rapid thermal annealing (RTA) apparatus such as a lamp rapid thermal annealing (LRTA) apparatus or a gas rapid thermal annealing (GRTA) apparatus can be used. An LRTA apparatus is an apparatus for heating an object to be processed by radiation of light (an electromagnetic wave) emitted from a lamp such as a halogen lamp, a metal halide lamp, a xenon arc lamp, a carbon arc lamp, a high pressure sodium lamp, or a high pressure mercury lamp. A GRTA apparatus is an apparatus for heat treatment using a high-temperature gas.

By the heat treatment, hydrogen (water, a compound having a hydroxyl group) can be released from the oxide semiconductor film 342. Thus, impurities in the oxide semiconductor film 342 can be reduced.

Furthermore, hydrogen that is an unstable carrier source can be eliminated from the oxide semiconductor film 342 by the heat treatment, whereby the threshold voltage of the transistor can be prevented from being shifted negatively. As a result, the reliability of the transistor can be improved.

Figure 5B:
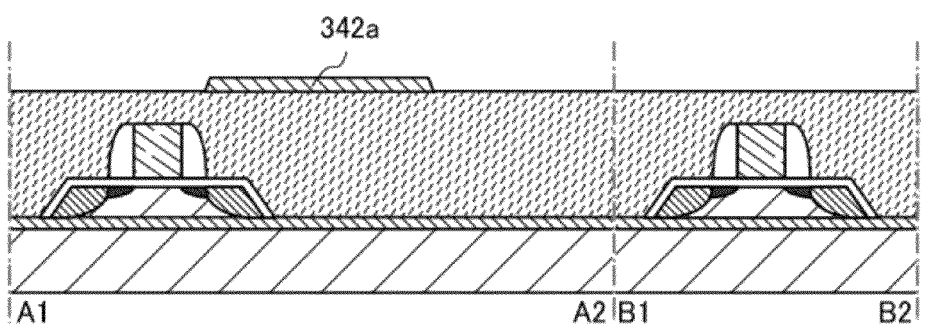

Next, a resist mask is formed through a photolithography process over the oxide semiconductor film 342, and the oxide semiconductor film 342 is etched to have a desired shape with the use of the resist mask; in this manner, an island-shaped oxide semiconductor film 342a is formed (see FIG. 5B). The resist mask can be formed by an ink-jet method, a printing method, or the like as appropriate, as well as through the photolithography process. The etching is preferably performed so that an end portion of the oxide semiconductor film 342a has a tapered shape. The end portion of the island-shaped oxide semiconductor film 342a is tapered, whereby coverage with a film which is formed later can be improved, and disconnection of the film can accordingly be prevented. The tapered shape can be formed by performing etching while the resist mask is made to recede.

Note that the case where the heat treatment is performed directly after the oxide semiconductor film 342 is formed is described here; however, the heat treatment may be performed after the island-shaped oxide semiconductor film 342a is obtained.

Figure 5C:
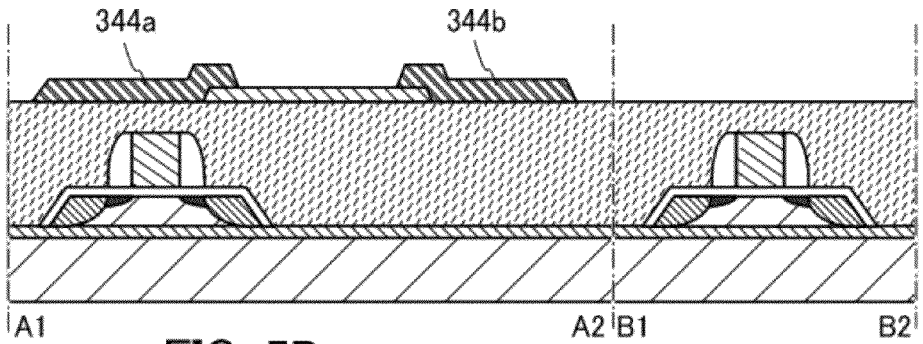

Next, after a conductive film is formed over the oxide semiconductor film 342a and the like, a resist mask is formed through a photolithography process over the conductive film and the conductive film is etched to have a desired shape with the use of the resist mask; in this manner, a source or drain electrode 344a and a source or drain electrode 344b are formed (see FIG. 5C).

The conductive film is to be a source electrode and a drain electrode later, and can be formed using a metal material such as aluminum, chromium, copper, titanium, tantalum, molybdenum, or tungsten. Alternatively, the conductive film can be formed using an alloy containing any of the above metal materials as a component, or the like. Moreover, any of manganese, magnesium, zirconium, beryllium, neodymium, and scandium, or a material including any of these in combination may be used.

The conductive film may have a single-layer structure or a stacked-layer structure of two or more layers. For example, the conductive film can have a single-layer structure of a titanium film or a titanium nitride film, a single-layer structure of an aluminum film containing silicon, a two-layer structure in which a titanium film is stacked over an aluminum film, a two-layer structure in which a titanium film is stacked over a titanium nitride film, or a three-layer structure in which a titanium film, an aluminum film, and a titanium film are stacked. Note that when the conductive film has a single-layer structure of a titanium film or a titanium nitride film, there is an advantage that it can be easily processed into the source and drain electrodes 344*a* and 344*b* having tapered shapes.

The conductive film is preferably etched such that the source and drain electrodes 344*a* and 344*b* are formed to have tapered end portions. Here, the taper angle thereof is, for example, preferably greater than or equal to 30° and less than or equal to 60°. When the source and drain electrodes 344*a* and 344*b* are formed by etching so as to have tapered end portions, coverage with the gate insulating film which is formed later can be improved and disconnection of the gate insulating film can be prevented.

The channel length (L) of the transistor is determined by the distance between a lower end portion of the source or drain electrode 344*a* and a lower end portion of the source or drain electrode 344*b*. Note that in light exposure for forming a mask for a transistor with a channel length (L) less than 25 nm, it is preferable to use extreme ultraviolet rays whose wavelength is as short as several nanometers to several tens of nanometers. The resolution of light exposure with extreme ultraviolet rays is high and the depth of focus is large. Accordingly, the channel length (L) of the transistor formed later can be greater than or equal to 10 nm and less than or equal to 1000 nm (1 μm), whereby the operation speed of the circuit can be increased.

Figure 5D:
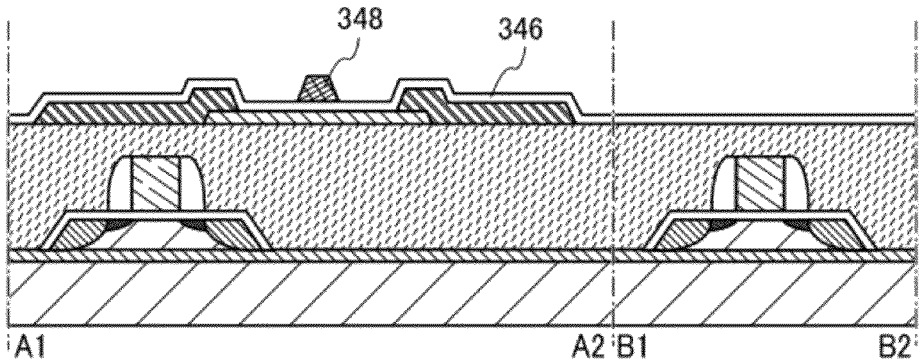

Next, a gate insulating film 346 is formed so as to cover the source and drain electrodes 344*a* and 344*b*, and the oxide semiconductor film 342*a* (see FIG. 5D).

The gate insulating film 346 can be formed by a CVD method, a sputtering method, or the like. The gate insulating film 346 can be formed using silicon oxide, silicon nitride, silicon oxynitride, gallium oxide, aluminum oxide, tantalum oxide, or the like. Alternatively, the gate insulating film 346 can be formed using a material with a high dielectric constant (a high-k material) such as hafnium oxide, yttrium oxide, hafnium silicate ($HfSi_xO_y$ (x>0, y>0)), hafnium silicate to which nitrogen is added ($HfSi_xO_yN_z$ (x>0, y>0, z>0)), or hafnium aluminate to which nitrogen is added ($HfAl_xO_yN_z$ (x>0, y>0, z>0)). The gate insulating film 346 has either a single-layer structure or a stacked-layer structure in which these materials are combined.

Further, the gate insulating film 346 may be formed using an insulating material containing a Group 13 element and oxygen. Many of oxide semiconductor materials contain a Group 13 element, and an insulating material containing a Group 13 element works well with oxide semiconductor materials. Therefore, with the use of an insulating material containing a Group 13 element and oxygen for an insulating film in contact with the oxide semiconductor film, an interface with the oxide semiconductor film can keep a favorable state.

Here, an insulating material containing a Group 13 element refers to an insulating material containing one or more Group 13 elements. As the insulating material containing a Group 13 element, gallium oxide, aluminum oxide, aluminum gallium oxide, gallium aluminum oxide, or the like can be given as an example. Here, the amount of aluminum is larger than that of gallium in atomic percent in aluminum gallium oxide, whereas the amount of gallium is larger than or equal to that of aluminum in atomic percent in gallium aluminum oxide.

For example, when a material containing gallium oxide is used for the gate insulating film 346 that is in contact with the oxide semiconductor film 342*a* containing gallium, characteristics at the interface between the oxide semiconductor film and the gate insulating film can be kept favorable. The oxide semiconductor film and an insulating film containing gallium oxide are provided in contact with each other, so that pileup of hydrogen at the interface between the oxide semiconductor film and the insulating film can be reduced. Note that a similar effect can be obtained in the case where an element in the same group as a constituent element of the oxide semiconductor is used in an insulating film. For example, it is effective to form an insulating film with the use of a material containing aluminum oxide. Note that aluminum oxide has a property of not easily transmitting water. Thus, it is preferable to use a material containing aluminum oxide in terms of preventing entry of water into the oxide semiconductor film.

By the heat treatment performed on the oxide semiconductor film 342 (or the oxide semiconductor film 342*a*), oxygen in the oxide semiconductor film 342 is released together with hydrogen. When oxygen is released from the oxide semiconductor film 342, oxygen deficiency is caused therein. Part of the oxygen deficiency becomes a donor, which leads to generation of carriers in the oxide semiconductor film 342. As a result, characteristics of the transistor might be affected.

Therefore, an insulating film from which oxygen is discharged by heat treatment is preferably used as the gate insulating film 346 in contact with the oxide semiconductor film 342*a*.

In this specification and the like, the expression "oxygen is discharged by heat treatment" means that the amount of discharged oxygen (or released oxygen) which is converted into oxygen atoms is greater than or equal to $1.0 \times 10^{18}$ cm$^{-3}$, preferably greater than or equal to $3.0 \times 10^{20}$ cm$^{-3}$, in thermal desorption spectroscopy (TDS) analysis. In contrast, the expression "oxygen is not discharged by heat treatment" means that the amount of discharged oxygen (or released oxygen) which is converted into oxygen atoms is less than $1.0 \times 10^{18}$ cm$^{-3}$ in TDS analysis.

A method for quantifying the amount of released oxygen which is converted into oxygen atoms, with the use of TDS analysis is described below.

The amount of discharged gas in TDS analysis is proportional to the integral value of ion intensity. Therefore, the amount of discharged gas can be calculated from the ratio between the integral value of ion intensity of an insulating film and the reference value of a standard sample. The reference value of a standard sample refers to, in a sample containing an atom at a predetermined density, the ratio of the density of the atom to the integral value of ion intensity corresponding to the atom.

For example, the number of the discharged oxygen molecules ($N_{O2}$) from an insulating film can be found according to the following formula (2) with the TDS analysis results of a silicon wafer containing hydrogen at a predetermined density which is the standard sample and the TDS analysis results of the insulating film. Here, all gases having a mass number of 32 which are obtained in the TDS analysis are assumed to originate from an oxygen molecule. Note that $CH_3OH$, which is given as a gas having a mass number of 32, is not taken into consideration on the assumption that it is unlikely to be present. Further, an oxygen molecule including an oxygen atom having a mass number of 17 or 18 which is an isotope of an oxygen atom is not taken into consideration either because the proportion of such a molecule in the natural world is minimal.

[FORMULA 2]

$$N_{O2} = N_{H2}/S_{H2} \times S_{O2} \times \alpha \quad (2)$$

In the formula, $N_{H2}$ is the value obtained by conversion of the number of hydrogen molecules desorbed from the standard sample into densities, and $S_{H2}$ is the integral value of ion intensity when the standard sample is subjected to TDS analysis. Here, the reference value of the standard sample is set to $N_{H2}/S_{H2}$. Further, $S_{O2}$ is the integral value of ion intensity when the insulating film is subjected to TDS analysis, and $\alpha$ is a coefficient affecting the ion intensity in the TDS analysis. Japanese Published Patent Application No. H6-275697 can be referred to for details of the formula (2). Note that the above value of the amount of discharged oxygen is obtained by measurement with a thermal desorption spectrometer produced by ESCO Ltd., EMD-WA1000S/W using a silicon wafer containing hydrogen atoms at $1 \times 10^{16}$ cm$^{-3}$ as the standard sample.

Further, in the TDS analysis, part of oxygen is detected as an oxygen atom. The ratio between oxygen molecules and oxygen atoms can be calculated from the ionization rate of the oxygen molecules. Note that, since the above $\alpha$ includes the ionization rate of the oxygen molecules, the number of the discharged oxygen atoms can also be estimated through the evaluation of the number of the discharged oxygen molecules.

Note that $N_{O2}$ is the number of the discharged oxygen molecules. In the insulating film, the amount of discharged oxygen when converted into oxygen atoms is twice the number of the discharged oxygen molecules.

As an example of a film from which oxygen is discharged by heat treatment, a film of oxygen-excess silicon oxide ($SiO_x$ (x>2)) is given. In the oxygen-excess silicon oxide ($SiO_x$ (x>2)), the number of oxygen atoms per unit volume is more than twice the number of silicon atoms per unit volume. The number of silicon atoms and the number of oxygen atoms per unit volume are measured by Rutherford backscattering spectrometry.

An insulating film from which oxygen is discharged by heat treatment is used as an insulating film in contact with the oxide semiconductor film 342a (for example, the insulating film 324, the gate insulating film 346), and is subjected to heat treatment in any of steps after the formation of the gate insulating film 346, so that oxygen is discharged from the insulating film 324 and the gate insulating film 346 to be supplied to the oxide semiconductor film 342a. Consequently, oxygen deficiency generated in the oxide semiconductor film 342a can be compensated for and can be reduced. Therefore, generation of carriers in the oxide semiconductor film 342a can be suppressed, whereby variation in electrical characteristics of the transistor can be suppressed.

Next, after a conductive film is formed over the gate insulating film 346, a resist mask is formed through a photolithography process over the conductive film and the conductive film is etched to have a desired shape with the use of the resist mask, so that a gate electrode 348 is formed (see FIG. 5D). The conductive film can be formed by using a metal material such as molybdenum, titanium, tantalum, tungsten, aluminum, copper, neodymium, or scandium, or an alloy material containing any of these materials as a main component. The conductive film can have either a single-layer structure or a stacked-layer structure.

Figure 6A:
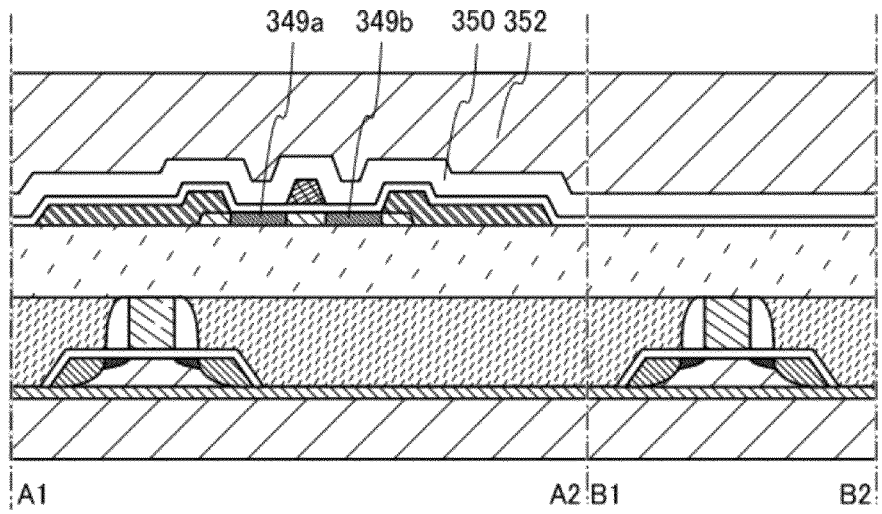
FIGS. 6A and 6B are cross-sectional views illustrating an example of a manufacturing process of a transistor.

A dopant imparting n-type conductivity is added to the oxide semiconductor film 342a with the use of the gate electrode 348, the source and drain electrodes 344a and 344b as masks; in this manner, a pair of dopant regions 349a and 349b are formed (see FIG. 6A). In the oxide semiconductor film 342a, a region between the dopant region 349a and the dopant region 349b serves a channel. The channel in the oxide semiconductor film 342a overlaps with the gate electrode 348 with the gate insulating film 346 interposed therebetween.

The addition of the dopant for forming the dopant regions 349a and 349b can be performed by an ion implantation method. As the dopant, for example, a rare gas such as helium, argon, or xenon, a Group 15 element such as nitrogen, phosphorus, arsenic, or antimony, or the like can be used. For example, in the case where nitrogen is used as the dopant, the concentration of nitrogen atoms in the dopant regions 349a and 349b is preferably higher than or equal to $5 \times 10^{19}$/cm$^3$ and lower than or equal to $1 \times 10^{22}$/cm$^3$. The dopant regions 349a and 349b to which the dopant imparting n-type conductivity is added have higher conductivity than the other regions in the oxide semiconductor film 342a. Therefore, by providing the dopant regions 349a and 349b in the oxide semiconductor film 342a, the resistance between the source and drain electrodes 344a and 344b can be decreased.

Then, an insulating film 350 and an insulating film 352 are formed over the gate insulating film 346 and the gate electrode 348 (see FIG. 6A). The insulating film 350 and the insulating film 352 can be formed by a PVD method, a CVD method, or the like. The insulating film 350 and the insulating film 352 can be formed using a material containing an inorganic insulating material such as silicon oxide, silicon oxynitride, silicon nitride, hafnium oxide, gallium oxide, or aluminum oxide, or a material containing an organic material such as polyimide or acrylic. Note that for the insulating film 350 and the insulating film 352, a material with a low dielectric constant or a structure with a low dielectric constant (e.g., a porous structure) is preferably used. This is because when the insulating layer 150 and the insulating layer 152 have a low dielectric constant, capacitance generated between wirings, electrodes, or the like can be reduced and operation at higher speed can be achieved. For example, a material containing an inorganic material can be used for the insulating film 350 and a material containing an organic material can be used for the insulating film 352.

An aluminum oxide film has a property of blocking hydrogen, water, and the like. Therefore, the insulating film 350 is preferably formed using an aluminum oxide film in order to prevent hydrogen, water, and the like from entering the oxide semiconductor film 342a from the outside of the memory device. Further, an aluminum oxide film also has a property of blocking oxygen, so that outward diffusion of oxygen contained in the oxide semiconductor film 342a can be suppressed. The use of an aluminum oxide film for the insulating film 350 not only can prevent hydrogen, water, and the like from entering the oxide semiconductor film 342a but also can suppress outward diffusion of oxygen contained in the oxide semiconductor film 342a. Therefore, variation in electrical characteristics of the transistor can be suppressed.

Next, an opening reaching the source or drain electrode 344b is formed in the gate insulating film 346, the insulating film 350, and the insulating film 352. The opening is formed by selective etching with the use of a mask or the like. After that, a conductive film is formed in contact with the source or drain electrode 344b. Next, the conductive film is subjected to etching or CMP treatment to form an electrode 354 (see FIG. 6B).

Figure 6B:
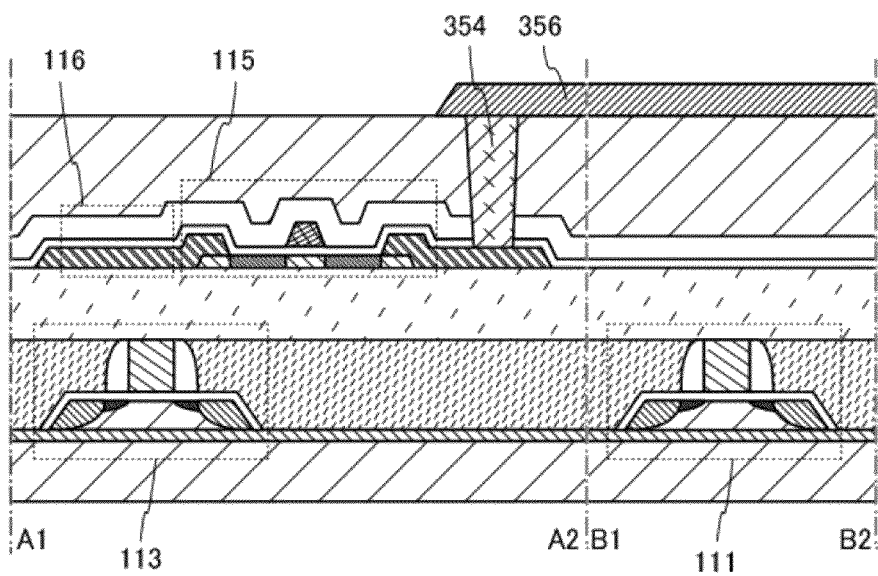

Next, a wiring 356 is formed over the insulating film 352 and be in contact with the electrode 354 (see FIG. 6B). The wiring 356 is formed in such a manner that a conductive film is formed by a PVD method or a CVD method and then the conductive film is processed. For the conductive film, a metal material such as aluminum, chromium, copper, tantalum, titanium, molybdenum, or tungsten, an alloy containing any of these metal materials as a component, or the like can be used. Any of manganese, magnesium, zirconium, beryllium, neodymium, and scandium, or a material including any of these in combination may be used.

Further, the wiring 356 may be formed without formation of the electrode 354. For example, it is possible to employ a method in which a thin titanium film is formed in a region including the opening of the insulating film 350 by a PVD method and then an aluminum film is formed so as to be embedded in the opening. Here, the titanium film formed by a PVD method has a function of reducing an oxide film (e.g., a natural oxide film) formed on a surface where the titanium film is formed, to decrease contact resistance with a lower electrode or the like (here, the source or drain electrode 344b). A copper film may be formed by a plating method after the formation of the barrier film of titanium, titanium nitride, or the like.

By the wiring 356, the lower transistor and the upper transistor can be connected to each other (not illustrated).

Though the above steps, the n-channel transistor 113 and the p-channel transistor 111 which are included in the flip-flop 10 and a transistor 115 in which the channel is formed in the oxide semiconductor film and which is included in the memory 11 are completed (see FIG. 6B).

Modification Example of Transistor

Modification examples of the transistor whose channel is formed in the oxide semiconductor film will be described below with reference to FIGS. 7A to 7C.

Figure 7A:
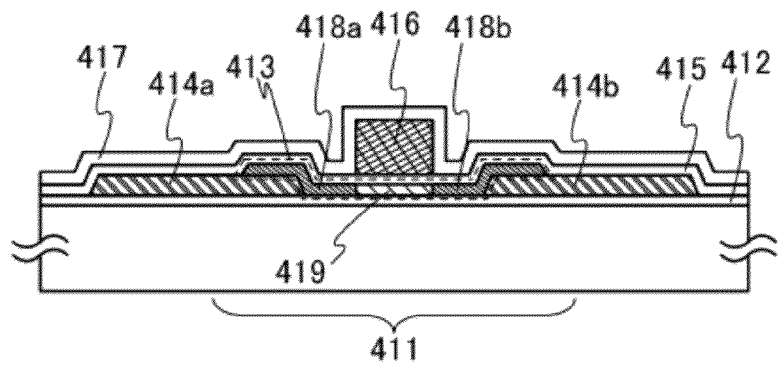
FIGS. 7A to 7C are cross-sectional views each illustrating an example of a transistor.

A transistor 411 illustrated in FIG. 7A includes a source or drain electrode 414a and a source or drain electrode 414b which are formed over the base film 412, an oxide semiconductor film 413 which is formed over the source and drain electrodes 414a and 414b, a gate insulating film 415 over the oxide semiconductor film 413 and the source and drain electrodes 414a and 414b, and a gate electrode 416 provided over the gate insulating film 415 so as to overlap with the oxide semiconductor film 413. Further, a protective insulating film 417 is provided over the transistor 411.

The transistor 411 illustrated in FIG. 7A has a top-gate structure where the gate electrode 416 is formed over the oxide semiconductor film 413, and has a bottom-contact structure where the source and drain electrodes 414a and 414b are formed below the oxide semiconductor film 413. In addition, the source and drain electrodes 414a and 414b and the gate electrode 416 do not overlap in the transistor 411; thus, parasitic capacitance between the gate electrode 416 and the source and drain electrodes 414a and 414b can be made low, so that high-speed operation can be realized.

The oxide semiconductor film 413 includes a pair of dopant regions 418a and 418b which are obtained by addition of a dopant imparting n-type conductivity to the oxide semiconductor film 413 after formation of the gate electrode 416. Further, in the oxide semiconductor film 413, a region with which the gate electrode 416 overlaps with the gate insulating film 415 provided therebetween is a region 419 where a channel is formed. In the oxide semiconductor film 413, the region 419 where the channel is formed is provided between the pair of dopant regions 418a and 418b. The addition of the dopant for forming the dopant regions 418a and 418b can be performed by an ion implantation method. A rare gas such as helium, argon, or xenon, nitrogen, phosphorus, arsenic, antimony, boron, or the like can be used as the dopant, for example.

For example, in the case where nitrogen is used as the dopant, the concentration of nitrogen atoms in the dopant regions 418a and 418b is preferably higher than or equal to $5\times10^{19}/cm^3$ and lower than or equal to $1\times10^{22}/cm^3$.

The dopant regions 418a and 418b to which the dopant imparting n-type conductivity is added have higher conductivity than the other regions in the oxide semiconductor film 413. Therefore, by providing the dopant regions 418a and 418b in the oxide semiconductor film 413, the resistance between the source and drain electrodes 414a and 414b can be decreased.

Further, the oxide semiconductor film 413 may be a CAAC-OS film. When the oxide semiconductor film 413 is a CAAC-OS film, the conductivity of the oxide semiconductor film 413 can be higher than that in the case of using an amorphous oxide semiconductor film; therefore, the resistance between the source and drain electrodes 414a and 414b can be reduced.

By reducing the resistance between the source and drain electrodes 414a and 414b, a high on-state current and high-speed operation can be ensured even when the transistor 411 is miniaturized. In addition, by miniaturization of the transistor 411, the area of a semiconductor device including the transistor can be reduced, so that the number of transistors per unit area can be increased.

Figure 7B:
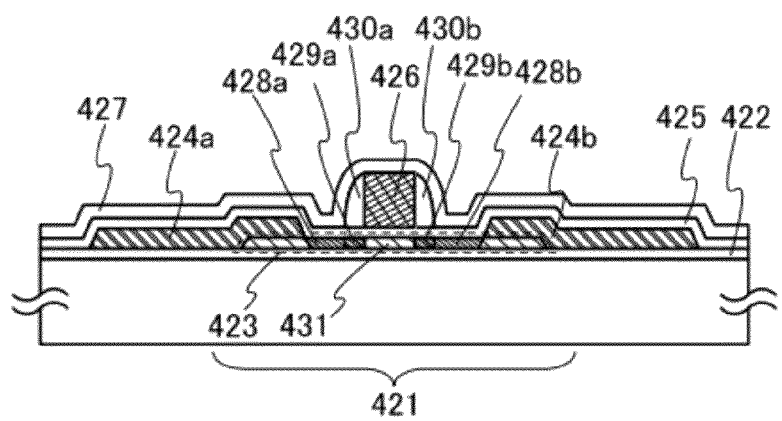

A transistor 421 illustrated in FIG. 7B includes an oxide semiconductor film 423 formed over a base film 422, a source or drain electrode 424a and a source or a drain electrode 424b which are formed over the oxide semiconductor film 423, a gate insulating film 425 over the oxide semiconductor film 423 and the source and drain electrodes 424a and 424b, a gate electrode 426 provided over the gate insulating film 425 so as to overlap with the oxide semiconductor film 423, and a protective insulating film 427 provided over the gate electrode 426 and covering the oxide semiconductor film 423. The transistor 421 further includes sidewalls 430a and 430b provided on side surfaces of the gate electrode 426 and formed using an insulating film.

The transistor 421 illustrated in FIG. 7B has a top-gate structure where the gate electrode 426 is formed over the oxide semiconductor film 423, and has a top-contact structure where the source and drain electrodes 424a and 424b are formed over the oxide semiconductor film 423. In addition, similarly to the transistor 411, the source and drain electrodes 424a and 424b and the gate electrode 426 do not overlap in the transistor 421; thus, parasitic capacitance between the gate electrode 426 and the source and drain electrodes 424a and 424b can be made low, so that high-speed operation can be realized.

The oxide semiconductor film 423 includes a pair of high-concentration dopant regions 428a and 428b and a pair of low-concentration dopant regions 429a and 429b which are obtained by addition of dopants imparting n-type conductivity to the oxide semiconductor film 423 after formation of the gate electrode 426. Further, in the oxide semiconductor film 423, a region with which the gate electrode 426 overlaps with the gate insulating film 425 provided therebetween is a region 431 where a channel is formed. In the oxide semiconductor film 423, the pair of low-concentration dopant regions 429a and 429b are provided between the pair of high-concentration dopant regions 428a and 428b, and the region 431 where the channel is formed is provided between the pair of low-concentration dopant regions 429a and 429b. The pair of low-concentration dopant regions 429a and 429b are provided in regions which are included in the oxide semiconductor film 423 and overlap with the sidewalls 430a and 430b with the gate insulating film 425 provided therebetween.

Similarly to the dopant regions 418a and 418b included in the transistor 411, the high-concentration dopant regions 428a and 428b and the low-concentration dopant regions 429a and 429b can be formed by an ion implantation method. The description of the dopant regions 418a and 418b can be referred to for the kind of the dopant for forming the high-concentration dopant regions 428a and 428b.

For example, in the case where nitrogen is used as the dopant, the concentration of nitrogen atoms in the high-concentration dopant regions 428a and 428b is preferably higher than or equal to $5 \times 10^{19}/cm^3$ and lower than or equal to $1 \times 10^{22}/cm^3$. Moreover, in the case where nitrogen is used as the dopant, for example, the concentration of nitrogen atoms in the low-concentration dopant regions 429a and 429b is preferably higher than or equal to $5 \times 10^{18}/cm^3$ and lower than $5 \times 10^{19}/cm^3$.

The high-concentration dopant regions 428a and 428b to which the dopant imparting n-type conductivity is added have higher conductivity than the other regions in the oxide semiconductor film 423. Therefore, by providing the high-concentration dopant regions 428a and 428b in the oxide semiconductor film 423, the resistance between the source and drain electrodes 424a and 424b can be decreased. The low-concentration dopant regions 429a and 429b are provided between the region 431 where the channel is formed and the high-concentration dopant regions 428a and 428b, so that a negative shift of the threshold voltage due to a short-channel effect can be reduced.

Further, the oxide semiconductor film 423 may be a CAAC-OS film. When the oxide semiconductor film 423 is a CAAC-OS film, the conductivity of the oxide semiconductor film 423 can be higher than that in the case of using an amorphous oxide semiconductor film; therefore, the resistance between the source and drain electrodes 424a and 424b can be reduced.

By reducing the resistance between the source and drain electrodes 424a and 424b, a high on-state current and high-speed operation can be ensured even when the transistor 421 is miniaturized.

Figure 7C:
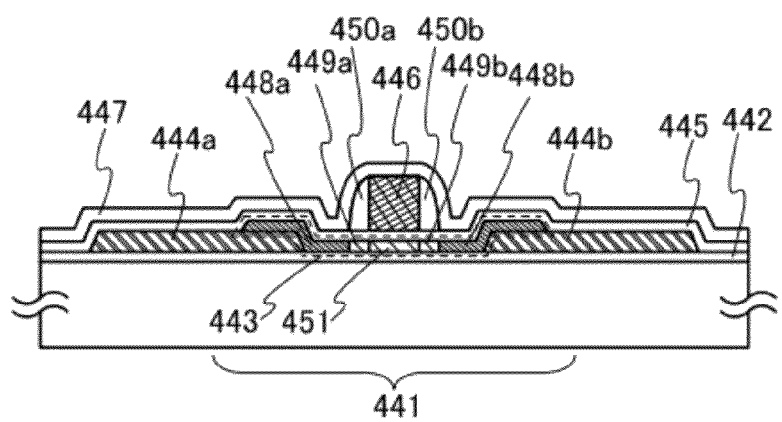

A transistor 441 illustrated in FIG. 7C includes a source or drain electrode 444a and a source or drain electrode 444b which are formed over a base film 442, an oxide semiconductor film 443 which is formed over the source and drain electrodes 444a and 444b and which serves as an active layer, a gate insulating film 445 over the oxide semiconductor film 443 and the source and drain electrodes 444a and 444b, a gate electrode 446 provided over the gate insulating film 445 so as to overlap with the oxide semiconductor film 443, and sidewalls 450a and 450b which are provided on side surfaces of the gate electrode 446 and which are formed using an insulating film. Further, a protective insulating film 447 is formed over the transistor 441.

The transistor 441 illustrated in FIG. 7C has a top-gate structure where the gate electrode 446 is formed over the oxide semiconductor film 443, and has a bottom-contact structure where the source and drain electrodes 444a and 444b are formed below the oxide semiconductor film 443. In addition, similarly to the transistor 411, the source and drain electrodes 444a and 444b and the gate electrode 446 do not overlap in the transistor 441; thus, parasitic capacitance between the gate electrode 446 and the source and drain electrodes 444a and 444b can be made low, so that high-speed operation can be realized.

The oxide semiconductor film 443 includes a pair of high-concentration dopant regions 448a and 448b and a pair of low-concentration dopant regions 449a and 449b which are obtained by addition of dopants imparting n-type conductivity to the oxide semiconductor film 443 after formation of the gate electrode 446. Further, in the oxide semiconductor film 443, a region with which the gate electrode 446 overlaps with the gate insulating film 445 provided therebetween is a region 451 where a channel is formed. In the oxide semiconductor film 443, the pair of low-concentration dopant regions 449a and 449b are provided between the pair of high-concentration dopant regions 448a and 448b, and the region 451 where the channel is formed is provided between the pair of low-concentration dopant regions 449a and 449b. The pair of low-concentration dopant regions 449a and 449b are provided in regions which are included in the oxide semiconductor film 443 and with which the sidewalls 450a and 450b overlap with the gate insulating film 445 provided therebetween.

Similarly to the dopant regions 418a and 418b included in the transistor 411, the high-concentration dopant regions 448a and 448b and the low-concentration dopant regions 449a and 449b can be formed by an ion implantation method. The description of the dopant regions 418a and 418b can be referred to for the kind of the dopant for forming the high-concentration dopant regions 448a and 448b.

For example, in the case where nitrogen is used as the dopant, the concentration of nitrogen atoms in the high-concentration dopant regions 448a and 448b is preferably higher than or equal to $5 \times 10^{19}/cm^3$ and lower than or equal to $1 \times 10^{22}/cm^3$. Moreover, in the case where nitrogen is used as the dopant, for example, the concentration of nitrogen atoms in the low-concentration dopant regions 449a and 449b is preferably higher than or equal to $5 \times 10^{18}/cm^3$ and lower than $5 \times 10^{19}/cm^3$.

The high-concentration dopant regions 448a and 448b to which the dopant imparting n-type conductivity is added have higher conductivity than the other regions in the oxide semiconductor film 443. Therefore, by providing the high-concentration dopant regions 448a and 448b in the oxide semiconductor film 443, the resistance between the source and drain electrodes 444a and 444b can be decreased. The low-concentration dopant regions 449a and 449b are provided between the region 451 where the channel is formed and the high-concentration dopant regions 448a and 448b, so that a negative shift of the threshold voltage due to a short-channel effect can be reduced.

Further, the oxide semiconductor film 443 may be a CAAC-OS film. When the oxide semiconductor film 443 is a CAAC-OS film, the conductivity of the oxide semiconductor film 443 can be higher than that in the case of using an amorphous oxide semiconductor film; therefore, the resistance between the source and drain electrodes 444a and 444b can be reduced.

By reducing the resistance between the source and drain electrodes 444a and 444b, a high on-state current and high-speed operation can be ensured even when the transistor 441 is miniaturized. In addition, by miniaturization of the transistor 441, the area of a semiconductor device including the transistor can be reduced, so that the number of transistors per unit area can be increased.

A base film positioned below the oxide semiconductor film or a protective insulating film positioned above the oxide semiconductor film is preferably formed using a material that has a high barrier property against an alkali metal, hydrogen, and oxygen. For example, as the insulating film having a high barrier property, a silicon nitride film, a silicon nitride oxide film, an aluminum nitride film, an aluminum oxide film, an aluminum oxynitride film, an aluminum nitride oxide film, or the like can be used. As the base film and the protective insulating film, a single layer or a stack of layers of the insulating film having a high barrier property, or a stack of layers of the insulating film having a high barrier property and the insulating film having a low barrier property may be used.

Covering the oxide semiconductor film with an insulating film having a high barrier property can prevent entry of impurities from the outside and release of oxygen from the oxide semiconductor film. Therefore, the reliability of the transistor can be improved.

Example of Crystal Structure of Oxide Semiconductor

A CAAC-OS film will be described below.

An example of a crystal structure of the CAAC-OS film will be described in detail with reference to FIGS. 8A to 8E, FIGS. 9A to 9C, FIGS. 10A to 10C, and FIGS. 11A and 11B. In FIGS. 8A to 8E, FIGS. 9A to 9C, FIGS. 10A to 10C, and FIGS. 11A and 11B, the vertical direction corresponds to the c-axis direction and a plane perpendicular to the c-axis direction corresponds to the a-b plane, unless otherwise specified. When the expressions "an upper half" and "a lower half" are simply used, they refer to an upper half above the a-b plane and a lower half below the a-b plane (an upper half and a lower half with respect to the a-b plane). Furthermore, in FIGS. 8A to 8E, O surrounded by a circle represents a tetracoordianate O atom and a double circle represents a tricoordinate O atom.

Figure 8A:
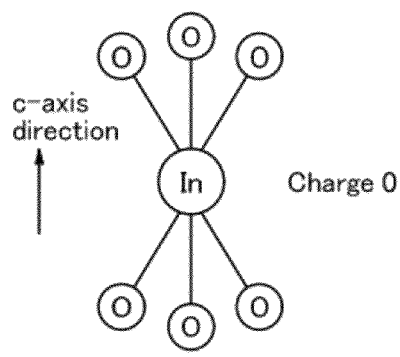
FIGS. 8A to 8E each illustrate a crystal structure of an oxide semiconductor.

FIG. 8A illustrates a structure including one hexacoordinate In atom and six tetracoordinate oxygen (hereinafter referred to as tetracoordinate O) atoms proximate to the In atom. Here, a structure including one metal atom and oxygen atoms proximate thereto is referred to as a small group. The structure in FIG. 8A is actually an octahedral structure, but is illustrated as a planar structure for simplicity. Note that three tetracoordinate O atoms exist in each of an upper half and a lower half in FIG. 8A. In the small group illustrated in FIG. 8A, charge is 0.

Figure 8D:
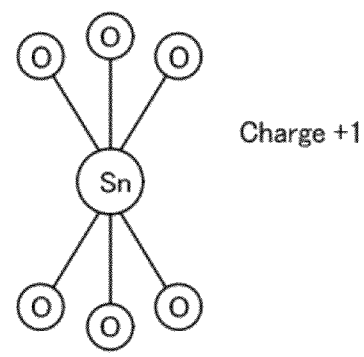
Figure 8B:
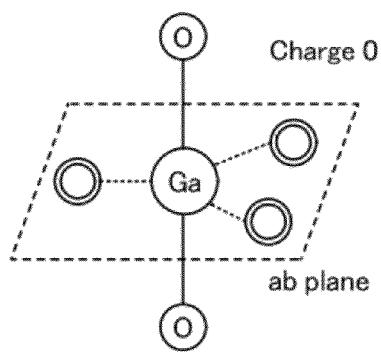

FIG. 8B illustrates a structure including one pentacoordinate Ga atom, three tricoordinate oxygen (hereinafter referred to as tricoordinate O) atoms proximate to the Ga atom, and two tetracoordinate O atoms proximate to the Ga atom. All the tricoordinate O atoms exist on the a-b plane. One tetracoordinate O atom exists in each of an upper half and a lower half in FIG. 8B. An In atom can also have the structure illustrated in FIG. 8B because an In atom can have five ligands. In the small group illustrated in FIG. 8B, charge is 0.

Figure 8E:
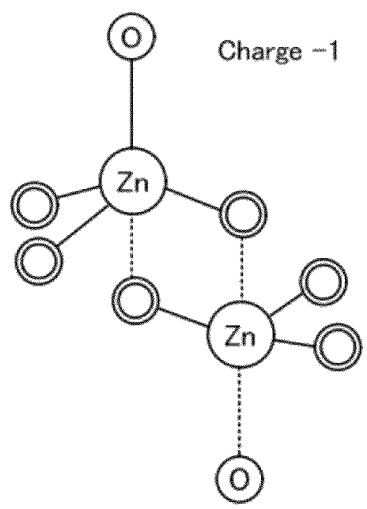
Figure 8C:
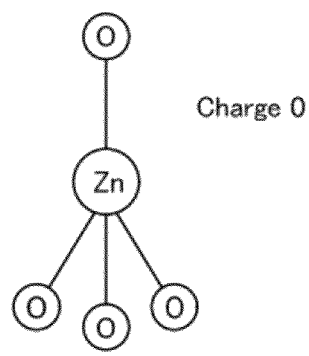

FIG. 8C illustrates a structure including one tetracoordinate Zn atom and four tetracoordinate O atoms proximate to the Zn atom. In FIG. 8C, one tetracoordinate O atom exists in an upper half and three tetracoordinate O atoms exist in a lower half. Alternatively, three tetracoordinate O atoms may exist in the upper half and one tetracoordinate O atom may exist in the lower half in FIG. 8C. In the small group illustrated in FIG. 8C, charge is 0.

FIG. 8D illustrates a structure including one hexacoordinate Sn atom and six tetracoordinate O atoms proximate to the Sn atom. In FIG. 8D, three tetracoordinate O atoms exist in each of an upper half and a lower half. In the small group illustrated in FIG. 8D, charge is +1.

FIG. 8E illustrates a small group including two Zn atoms. In FIG. 8E, one tetracoordinate O atom exists in each of an upper half and a lower half. In the small group illustrated in FIG. 8E, charge is −1.

Here, a plurality of small groups form a medium group, and a plurality of medium groups form a large group (also referred to as a unit cell).

Now, a rule of bonding between the small groups will be described. The three O atoms in the upper half with respect to the hexacoordinate In atom in FIG. 8A each have three proximate In atoms in the downward direction, and the three O atoms in the lower half each have three proximate In atoms in the upward direction. The one O atom in the upper half with respect to the pentacoordinate Ga atom in FIG. 8B has one proximate Ga atom in the downward direction, and the one O atom in the lower half has one proximate Ga atom in the upward direction. The one O atom in the upper half with respect to the tetracoordinate Zn atom in FIG. 8C has one proximate Zn atom in the downward direction, and the three O atoms in the lower half each have three proximate Zn atoms in the upward direction. In this manner, the number of tetracoordinate O atoms above a metal atom is equal to the number of metal atoms proximate to and below the tetracoordinate O atoms; similarly, the number of tetracoordinate O atoms below a metal atom is equal to the number of metal atoms proximate to and above the tetracoordinate O atoms. Since the coordination number of the tetracoordinate O atom is 4, the sum of the number of the metal atoms proximate to and below the O atom and the number of the metal atoms proximate to and above the O atom is 4. Accordingly, when the sum of the number of tetracoordinate O atoms above a metal atom and the number of tetracoordinate O atoms below another metal atom is 4, the two kinds of small groups including the metal atoms can be bonded. For example, in the case where the hexacoordinate metal (In or Sn) atom is bonded through three tetracoordinate O atoms in the lower half, it is bonded to the pentacoordinate metal (Ga or In) atom or the tetracoordinate metal (Zn) atom.

A metal atom whose coordination number is 4, 5, or 6 is bonded to another metal atom through a tetracoordinate O atom in the c-axis direction. In addition to the above, a medium group can be formed in a different manner by combining a plurality of small groups so that the total charge of the layered structure is 0.

Figure 9A:
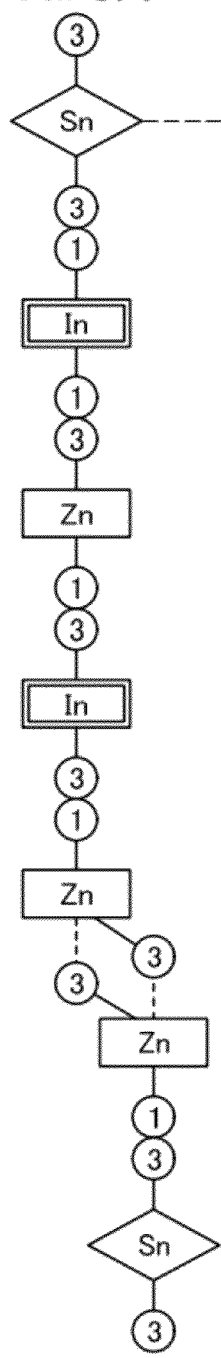
FIGS. 9A to 9C illustrate a crystal structure of an oxide semiconductor.
Figure 9B:
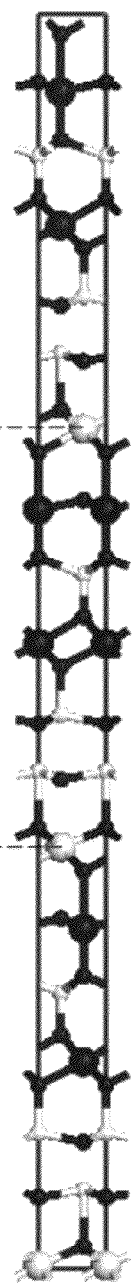
Figure 9C:
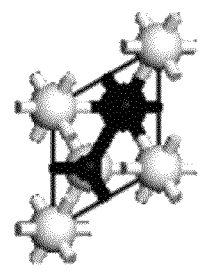

FIG. 9A illustrates a model of a medium group included in a layered structure of an In—Sn—Zn—O-based material. FIG. 9B illustrates a large group including three medium groups. Note that FIG. 9C illustrates an atomic arrangement in the case where the layered structure in FIG. 9B is observed from the c-axis direction.

In FIG. 9A, for simplicity, a tricoordinate O atom is omitted and a tetracoordinate O atom is illustrated by a circle; the number in the circle shows the number of tetracoordinate O atoms. For example, three tetracoordinate O atoms existing in each of an upper half and a lower half with respect to a Sn atom are denoted by circled 3. Similarly, in FIG. 9A, one tetracoordinate O atom existing in each of an upper half and a lower half with respect to an In atom is denoted by circled 1. FIG. 9A also illustrates a Zn atom proximate to one tetracoordinate O atom in a lower half and three tetracoordinate O atoms in an upper half, and a Zn atom proximate to one tetracoordinate O atom in an upper half and three tetracoordinate O atoms in a lower half.

In the medium group included in the layered structure of the In—Sn—Zn—O-based material in FIG. 9A, in the order starting from the top, a Sn atom proximate to three tetracoordinate O atoms in each of an upper half and a lower half is bonded to an In atom proximate to one tetracoordinate O atom in each of an upper half and a lower half, the In atom is bonded to a Zn atom proximate to three tetracoordinate O atoms in an upper half, the Zn atom is bonded to an In atom proximate to three tetracoordinate O atoms in each of an upper half and a lower half through one tetracoordinate O atom in a lower half with respect to the Zn atom, the In atom is bonded to a small group that includes two Zn atoms and is proximate to one tetracoordinate O atom in an upper half, and the small group is bonded to a Sn atom proximate to three tetracoordinate O atoms in each of an upper half and a lower half through one tetracoordinate O atom in a lower half with respect to the small group. A plurality of such medium groups are bonded, so that a large group is formed.

Here, charge for one bond of a tricoordinate O atom and charge for one bond of a tetracoordinate O atom can be assumed to be −0.667 and −0.5, respectively. For example, charge of a (hexacoordinate or pentacoordinate) In atom, charge of a (tetracoordinate) Zn atom, and charge of a (pentacoordinate or hexacoordinate) Sn atom are +3, +2, and +4, respectively. Accordingly, charge in a small group including a Sn atom is +1. Therefore, charge of −1, which cancels +1, is needed to form a layered structure including a Sn atom. As a structure having charge of −1, the small group including two Zn atoms as illustrated in FIG. 8E can be given. For example, with one small group including two Zn atoms, charge of one small group including a Sn atom can be cancelled, so that the total charge of the layered structure can be 0.

When the large group illustrated in FIG. 9B is repeated, an In—Sn—Zn—O-based crystal ($In_2SnZn_3O_8$) can be obtained. Note that a layered structure of the obtained In—Sn—Zn—O-based crystal can be expressed as a composition formula, $In_2SnZn_2O_7(ZnO)_m$ (m is 0 or a natural number).

The above-described rule also applies to the following oxides: an In—Sn—Ga—Zn—O-based oxide which is an oxide of four metal elements; an In—Ga—Zn—O-based oxide (also referred to as IGZO), an In—Al—Zn—O-based oxide, a Sn—Ga—Zn—O-based oxide, an Al—Ga—Zn—O-based oxide, a Sn—Al—Zn—O-based oxide, an In—Hf—Zn—O-based oxide, an In—La—Zn—O-based oxide, an In—Ce—Zn—O-based oxide, an In—Pr—Zn—O-based oxide, an In—Nd—Zn—O-based oxide, an In—Sm—Zn—O-based oxide, an In—Eu—Zn—O-based oxide, an In—Gd—Zn—O-based oxide, an In—Tb—Zn—O-based oxide, an In—Dy—Zn—O-based oxide, an In—Ho—Zn—O-based oxide, an In—Er—Zn—O-based oxide, an In—Tm—Zn—O-based oxide, an In—Yb—Zn—O-based oxide, or an In—Lu—Zn—O-based oxide, which is an oxide of three metal elements; an In—Zn—O-based oxide, a Sn—Zn—O-based oxide, an Al—Zn—O-based oxide, a Zn—Mg—O-based oxide, a Sn—Mg—O-based oxide, an In—Mg—O-based oxide, or an In—Ga—O-based oxide which is an oxide of two metal elements; and the like.

As an example, FIG. 10A illustrates a model of a medium group included in a layered structure of an In—Ga—Zn—O-based material.

In the medium group included in the layered structure of the In—Ga—Zn—O-based material in FIG. 10A, in the order starting from the top, an In atom proximate to three tetracoordinate O atoms in each of an upper half and a lower half is bonded to a Zn atom proximate to one tetracoordinate O atom in an upper half, the Zn atom is bonded to a Ga atom proximate to one tetracoordinate O atom in each of an upper half and a lower half through three tetracoordinate O atoms in a lower half with respect to the Zn atom, and the Ga atom is bonded to an In atom proximate to three tetracoordinate O atoms in each of an upper half and a lower half through one tetracoordinate O atom in a lower half with respect to the Ga atom. A plurality of such medium groups are bonded, so that a large group is formed.

FIG. 10B illustrates a large group including three medium groups. Note that FIG. 10C illustrates an atomic arrangement in the case where the layered structure in FIG. 10B is observed from the c-axis direction.

Here, since charge of a (hexacoordinate or pentacoordinate) In atom, charge of a (tetracoordinate) Zn atom, and charge of a (pentacoordinate) Ga atom are +3, +2, and +3, respectively, charge of a small group including any of an In atom, a Zn atom, and a Ga atom is 0. As a result, the total charge of a medium group having a combination of such small groups is always 0.

In order to form the layered structure of the In—Ga—Zn—O-based material, a large group can be formed using not only the medium group illustrated in FIG. 10A but also a medium group in which the arrangement of the In atom, the Ga atom, and the Zn atom is different from that in FIG. 10A.

When the large group illustrated in FIG. 10B is repeated, an In—Ga—Zn—O-based crystal can be obtained. Note that a layered structure of the obtained In—Ga—Zn—O-based crystal can be expressed as a composition formula, $InGaO_3(ZnO)_n$ (n is a natural number).

Figure 11A:
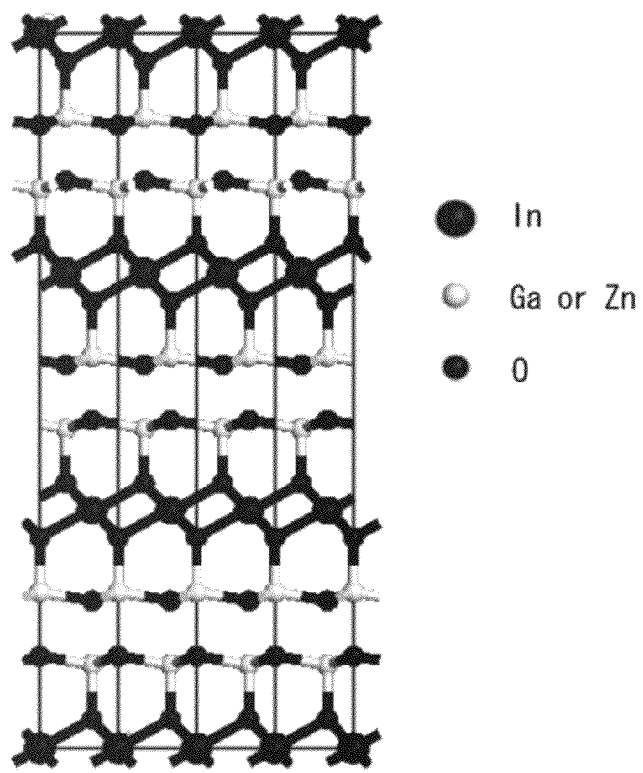
FIGS. 11A and 11B each illustrate a crystal structure of an oxide semiconductor.

In the case where n=1 ($InGaZnO_4$), a crystal structure illustrated in FIG. 11A can be obtained, for example. Note that in the crystal structure in FIG. 11A, since a Ga atom and an In atom each have five ligands as described with FIG. 8B, a structure in which Ga is replaced with In can be obtained.

Figure 11B:
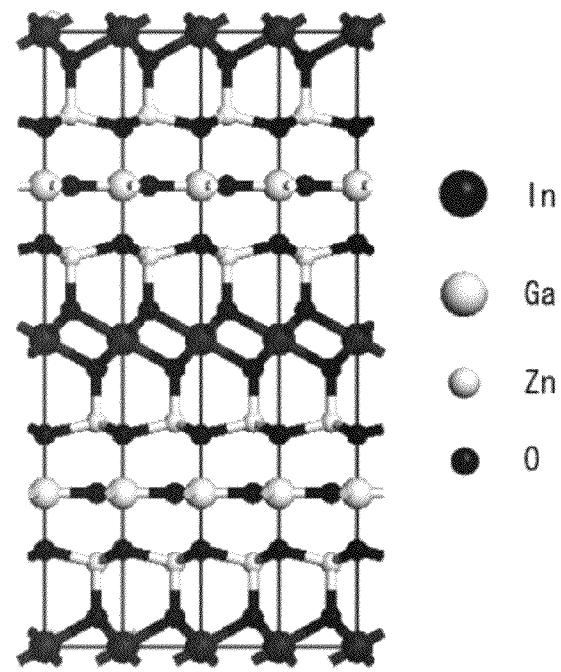

In the case where n=2 ($InGaZn_2O_5$), a crystal structure illustrated in FIG. 11B can be obtained, for example. Note that in the crystal structure in FIG. 11B, since a Ga atom and an In atom each have five ligands as described with FIG. 8B, a structure in which Ga is replaced with In can be obtained.

As described above, a variety of crystal structures of the CAAC-OS film can be obtained.

Characteristics of Transistor whose Channel is Formed in Oxide Semiconductor Film Electrical characteristics of a transistor whose channel is formed in an oxide semiconductor film will be described below.

Figure 12A:
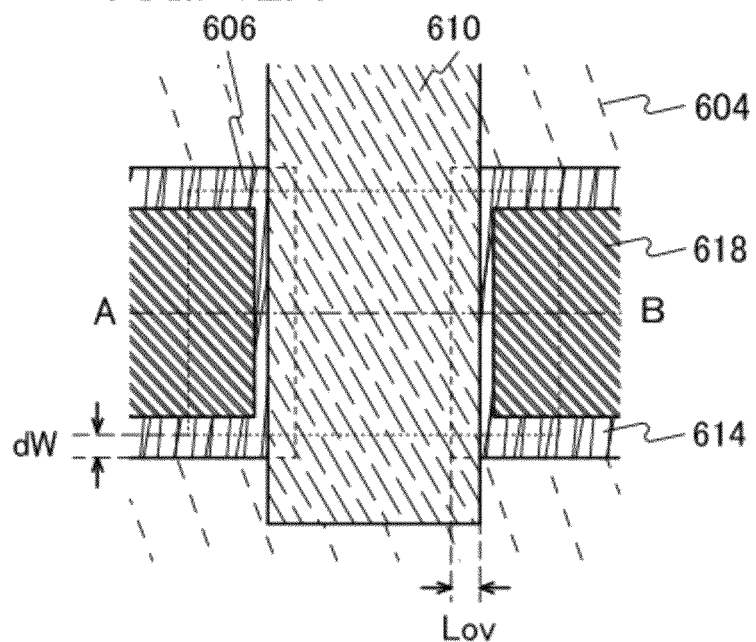
FIGS. 12A and 12B are a top view and a cross-sectional view illustrating an example of a transistor.
Figure 12B:
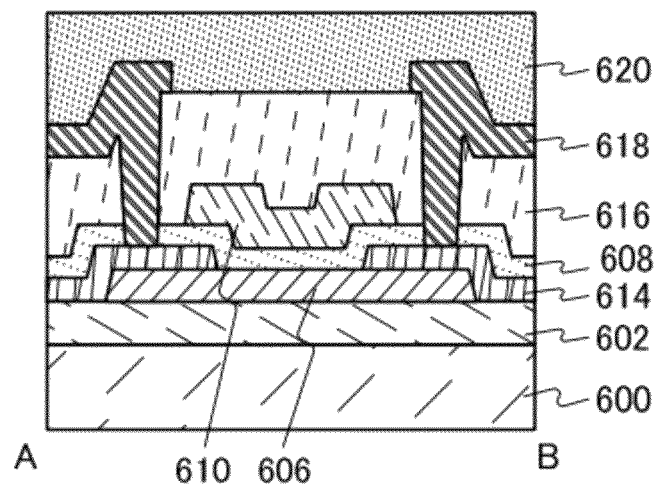

FIGS. 12A and 12B are a top view and a cross-sectional view of each of transistors (Sample 1 and Sample 2). FIG. 12A is a top view of each transistor. FIG. 12B is a cross-sectional view along dashed-dotted line A-B in FIG. 12A.

The transistor shown in FIG. 12B includes a substrate 600; a base insulating film 602 provided over the substrate 600; an oxide semiconductor film 606 provided over the base insulating film 602; a pair of electrodes 614 in contact with the oxide semiconductor film 606; a gate insulating film 608 provided over the oxide semiconductor film 606 and the pair of electrodes 614; a gate electrode 610 provided to overlap with the oxide semiconductor film 606 with the gate insulating film 608 provided therebetween; an interlayer insulating film 616 provided to cover the gate insulating film 608 and the gate electrode 610; wirings 618 connected to the pair of electrodes 614 through openings formed in the gate insulating film 608 and the interlayer insulating film 616; and a protective film 620 provided to cover the interlayer insulating film 616 and the wirings 618.

A glass substrate can be used as the substrate 600. A silicon oxide film can be used as the base insulating film 602. An In—Sn—Zn—O film can be used as the oxide semiconductor film 606. A tungsten film can be used as the pair of electrodes

614. A silicon oxide film can be used as the gate insulating film 608. A stacked-layer structure of a tantalum nitride film and a tungsten film can be used for the gate electrode 610. A stacked-layer structure of a silicon oxynitride film and a polyimide film can be used for the interlayer insulating film 616. A stacked-layer structure in which a titanium film, an aluminum film, and a titanium film are stacked in this order can be used for each of the wirings 618. A polyimide film can be used as the protective film 620.

In the transistor having the structure shown in FIG. 12A, the width of a portion where the gate electrode 610 overlaps with the electrode 614 is referred to as Lov. In addition, the width of a portion of the electrode 614 which does not overlap with the oxide semiconductor film 606 is referred to as dW.

A method for forming the transistors (Samples 1 and 2) having the structure shown in FIG. 12B is described below.

First, plasma treatment is performed on a surface of the substrate 600 in an argon atmosphere. The plasma treatment is carried out with a sputtering apparatus by applying a bias power of 200 W (RF) to the substrate 600 side for 3 minutes.

Subsequently, without breaking the vacuum, a silicon oxide film as the base insulating film 602 is formed to have a thickness of 300 nm.

The silicon oxide film is formed with a sputtering apparatus with a power of 1500 W (RF) in an oxygen atmosphere. A quartz target is used as a target. The substrate heating temperature in the film deposition is set at 100° C.

Next, a surface of the base insulating film 602 is processed by CMP to be planarized such that $R_a$ is about 0.2 nm.

Next, over the planarized base insulating film 602, an In—Sn—Zn—O film as the oxide semiconductor film is formed to have a thickness of 15 nm.

The In—Sn—Zn—O film is formed with a sputtering apparatus with a power of 100 W (DC) in a mixed atmosphere of argon:oxygen=2:3 [volume ratio]. An In—Sn—Zn—O target of In:Sn:Zn=1:1:1 [atomic ratio] is used as a target. The substrate heating temperature in the film deposition is set at 200° C.

Next, heat treatment is performed only on Sample 2 at 650° C. As the heat treatment, heat treatment in a nitrogen atmosphere is first performed for 1 hour and then heat treatment in an oxygen atmosphere is performed for 1 hour while keeping the temperature.

Then, a resist mask is formed by a photolithography process and the oxide semiconductor film is processed by etching using the resist mask, whereby the oxide semiconductor film 606 is formed.

Next, the tungsten film is formed over the oxide semiconductor film 606 to have a thickness of 50 nm.

The tungsten film is formed with a sputtering apparatus with a power of 1000 W (DC) in an argon atmosphere. The substrate heating temperature in the film deposition is set at 200° C.

Then, a resist mask is formed by a photolithography process and the tungsten film is processed by etching using the resist mask, whereby the pair of electrodes 614 are formed.

Next, a silicon oxide film as the gate insulating film 608 is formed to have a thickness of 100 nm. The relative permittivity of the silicon oxide film is set at 3.8.

The silicon oxide film as the gate insulating film 608 can be formed in a similar manner to the base insulating film 602.

Next, over the gate insulating film 608, a tantalum nitride film and a tungsten film are formed in this order to have thicknesses of 15 nm and 135 nm, respectively.

The tantalum nitride film is formed with a sputtering apparatus with a power of 1000 W (DC) in a mixed atmosphere of argon:nitrogen=5:1. Substrate heating is not performed in the film deposition.

The tungsten film is formed with a sputtering apparatus with a power of 4000 W (DC) in an argon atmosphere. The substrate heating temperature in the film deposition is set at 200° C.

Then, a resist mask is formed by a photolithography process and the tantalum nitride film and the tungsten film are processed by etching using the resist mask, whereby the gate electrode 610 is formed.

Next, a silicon oxynitride film as part of the interlayer insulating film 616 is formed over the gate insulating film 608 and the gate electrode 610 to have a thickness of 300 nm.

The silicon oxynitride film as part of the interlayer insulating film 616 is formed with a PCVD apparatus with a power of 35 W (RF) in a mixed atmosphere of monosilane:nitrous oxide=1:200. The substrate heating temperature in the film deposition is set at 325° C.

Then, a resist mask is formed by a photolithography process and the silicon oxynitride film as part of the interlayer insulating film 616 is processed by etching using the resist mask.

Next, photosensitive polyimide as part of the interlayer insulating film 616 is deposited to have a thickness of 1500 nm.

Next, the photosensitive polyimide as part of the interlayer insulating film 616 is exposed to light using a photomask which is used in the photolithography process on the silicon oxynitride film as part of the interlayer insulating film 616, and developed, and then subjected to heat treatment for hardening the photosensitive polyimide film. In this manner, the interlayer insulating film 616 is formed of the silicon oxynitride film and the photosensitive polyimide film. The heat treatment is performed in a nitrogen atmosphere at 300° C.

Next, a titanium film, an aluminum film, and a titanium film are formed in this order to have thicknesses of 50 nm, 100 nm, and 5 nm, respectively.

The two titanium films are formed with a sputtering apparatus with a power of 1000 W (DC) in an argon atmosphere.

The aluminum film is formed with a sputtering apparatus with a power of 1000 W (DC) in an argon atmosphere.

Then, a resist mask is formed by a photolithography process and the titanium film, the aluminum film, and the titanium film are processed by etching using the resist mask, whereby the wirings 618 are formed.

Next, a photosensitive polyimide film as the protective film 620 is formed to have a thickness of 1500 nm.

Next, the photosensitive polyimide film is exposed to light with the use of a photomask which is used in the photolithography process on the wirings 618, and developed, so that openings at which the wirings 618 are exposed are formed in the protective film 620.

Next, heat treatment for hardening the photosensitive polyimide film is performed thereon. The heat treatment is performed in a similar manner to the heat treatment performed on the photosensitive polyimide film as the interlayer insulating film 616.

Through the above process, the transistors (Samples 1 and 2) having the structure shown in FIG. 12B can be formed.

Next, evaluation results of electrical characteristics of the transistors (Samples 1 and 2) having the structure illustrated in FIG. 12B are described. Note that Sample 1 and Sample 2 are different in whether or not the heat treatment after formation of the In—Sn—Zn—O film is performed (refer to the above description).

Figure 13A:
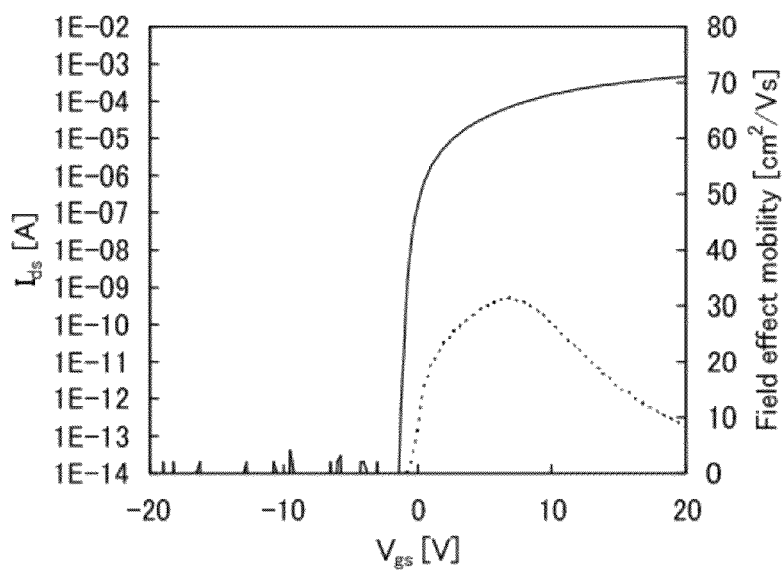
FIGS. 13A and 13B each show characteristics of a transistor.
Figure 13B:
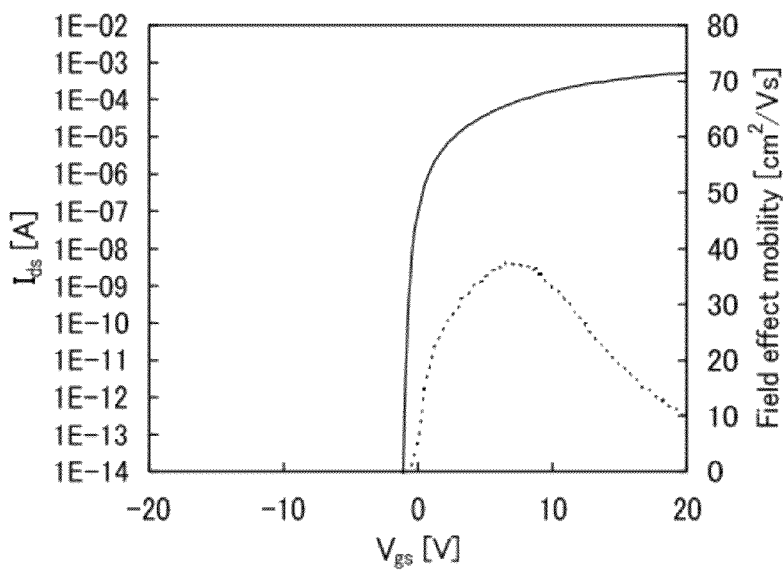

Here, $V_{gs}$-$I_{ds}$ characteristics of the transistors (Samples 1 and 2) having the structure illustrated in FIG. 12B were measured; the results of Sample 1 are shown in FIG. 13A and the results of Sample 2 are shown in FIG. 13B. Each transistor used for the measurement has a channel length L of 3 μm, a channel width W of 10 μm, Lov of 3 μm per side (6 μm in total), and dW of 3 μm per side (6 μm in total). Note that $V_{ds}$ is set at 10 V.

Comparing Samples 1 and 2, it is found that from the results of Sample 2, the field-effect mobility of the transistor is increased by performing heat treatment after formation of the oxide semiconductor film. The reason for this is deemed that the impurity concentration in the oxide semiconductor film is reduced by the heat treatment; accordingly, it is understood that the impurity concentration in the oxide semiconductor film is reduced by heat treatment performed after the oxide semiconductor film is formed, whereby the field-effect mobility of the transistor can be increased.

Next, evaluation results of the off-state current (per micrometer of a channel width) of the transistor are described.

The transistor used in the measurement has a channel length L of 3 μm, a channel width W of 10 cm, Lov of 2 μm, and dW of 0 μm.

Figure 14:
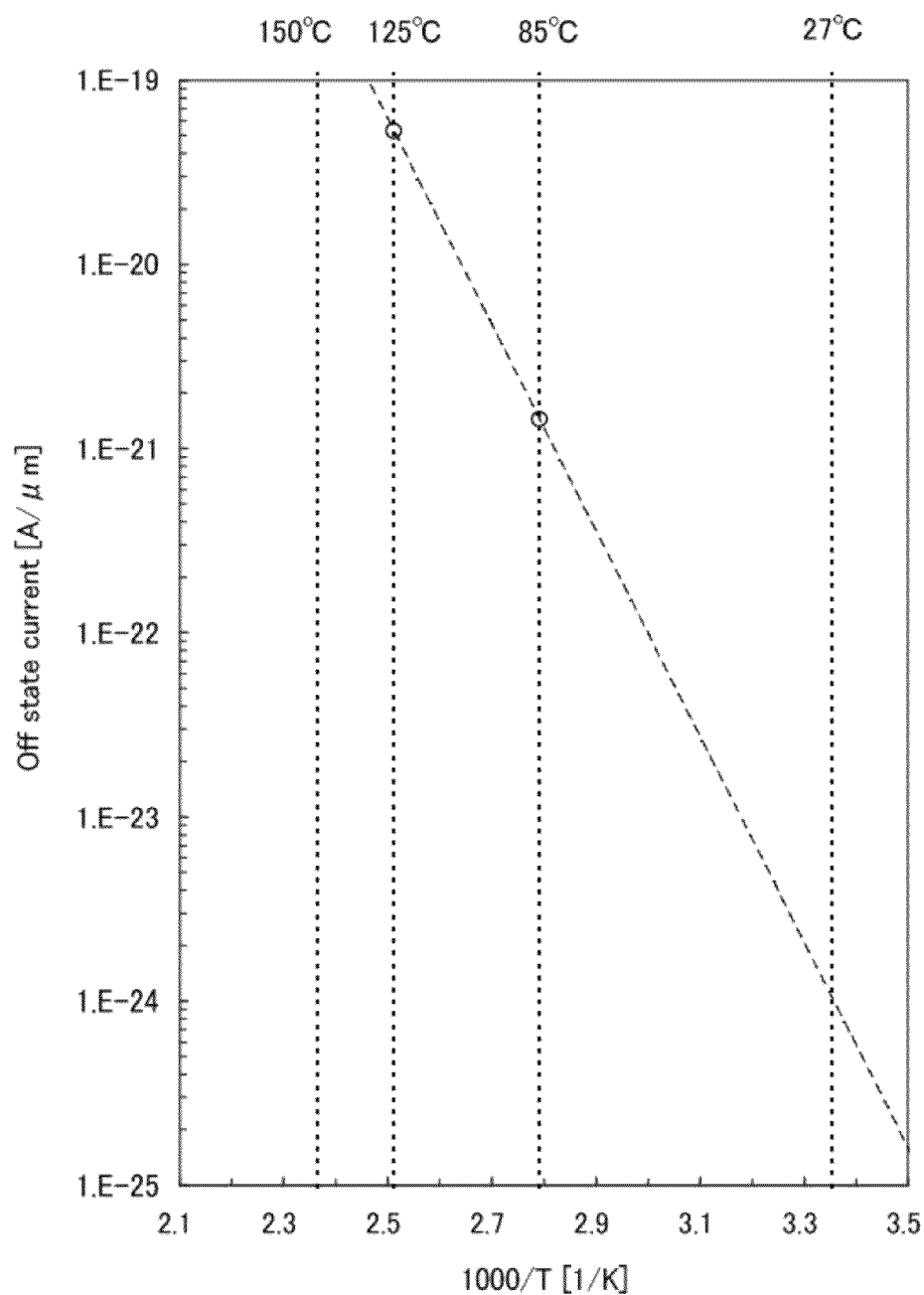
FIG. 14 shows characteristics of a transistor.

FIG. 14 shows a relation between the off-state current of the transistor and the inverse of the substrate temperature (absolute temperature) at measurement. For simplicity, a value (1000/T) obtained by multiplying the inverse of the substrate temperature at measurement by 1000 is indicated by the horizontal axis.

FIG. 14 shows that the off-state current of the transistor is $2 \times 10^{-21}$ A/μm (2 zA/μm) when a substrate temperature in measurement is 85° C.

As described above, it is found that the off-state current of the transistor whose channel is formed in the oxide semiconductor film is extremely small.

REFERENCE NUMERALS

1: reading portion, 2: arithmetic portion, 3: power supply control portion, 10: flip-flop, 11: memory, 12: correction portion, 51: transistor, 52: transistor, 53: capacitor, 54: capacitor, 55: transistor, 56: capacitor, 111: transistor, 113: transistor, 115: transistor, 300: substrate, 302: insulating film, 304: semiconductor film, 304a: semiconductor film, 304b: semiconductor film, 306a: gate insulating film, 306b: gate insulating film, 308: semiconductor film, 310: semiconductor film, 312a: gate electrode, 312b: gate electrode, 314a: impurity region, 314b: impurity region, 316a: impurity region, 316b: impurity region, 318a: sidewall insulating film, 318b: sidewall insulating film, 318c: sidewall insulating film, 318d: sidewall insulating film, 320a: impurity region, 320b: impurity region, 322a: impurity region, 322b: impurity region, 324: insulating film, 342: oxide semiconductor film, 342a: oxide semiconductor film, 344a: source or drain electrode, 344b: source or drain electrode, 346: gate insulating film, 348: gate electrode, 349a: dopant region, 349b: dopant region, 350: insulating film, 352: insulating film, 354: electrode, 356: wiring, 411: transistor, 412: base film, 413: oxide semiconductor film, 414a: source or drain electrode, 414b: source or drain electrode, 415: gate insulating film, 416: gate electrode, 417: protective insulating film, 418a: dopant region, 418b: dopant region, 419: region, 421: transistor, 422: base film, 423: oxide semiconductor film, 424a: source or drain electrode, 424b: source or drain electrode, 425: gate insulating film, 426: gate electrode, 427: protective insulating film, 428a: high-concentration dopant region, 428b: high-concentration dopant region, 429a: low-concentration dopant region, 429b: low-concentration dopant region, 430a: sidewall, 430b: sidewall, 431: region, 441: transistor, 442: base film, 443: oxide semiconductor film, 444a: source or drain electrode, 444b: source or drain electrode, 445: gate insulating film, 446: gate electrode, 447: protective insulating film, 448a: high-concentration dopant region, 448b: high-concentration dopant region, 449a: low-concentration dopant region, 449b: low-concentration dopant region, 450a: sidewall, 450b: sidewall, 451: region, 600: substrate, 602: base insulating film, 606: oxide semiconductor film, 608: gate insulating film, 610: gate electrode, 614: electrode, 616: interlayer insulating film, 618: wiring, and 620: protective film.

This application is based on Japanese Patent Application serial no. 2011-113275 filed with Japan Patent Office on May 20, 2011, the entire contents of which are hereby incorporated by reference.

The invention claimed is:

1. A semiconductor device comprising:
a first portion configured to read an instruction; and
a second portion configured to perform an operation in accordance with the instruction,
wherein the first portion comprises:
a flip-flop configured to read and hold the instruction;
a memory configured to receive the instruction from the flip-flop, and transmit the instruction to the flip-flop; and
a third portion configured to correct the instruction held in the memory or the instruction transmitted from the memory to the flip-flop in accordance with the operation performed by the second portion while the instruction is held in the memory, and
wherein reception and transmission of the instruction between the flip-flop and the memory are controlled with a signal output by the second portion.

2. The semiconductor device according to claim 1,
wherein the memory comprises:
a transistor in which a channel is formed in an oxide semiconductor; and
a capacitor,
wherein one of a source and a drain of the transistor is electrically connected to the flip-flop,
wherein the other of the source and the drain of the transistor is electrically connected to one of electrodes of the capacitor, and
wherein a gate of the transistor is electrically connected to the second portion.

3. A method for driving the semiconductor device according to claim 1, comprising:
reading a first instruction by the first portion;
transmitting the first instruction from the flip-flop to the memory;
reading a second instruction by the first portion;
operating by the second portion in accordance with the second instruction;
transmitting back the first instruction from the memory to the flip-flop; and
operating by the second portion in accordance with the first instruction.

4. A semiconductor device comprising:
a first portion configured to read an instruction; and
a second portion configured to perform an operation in accordance with the instruction,
wherein the first portion comprises:
a flip-flop configured to read and hold the instruction; and a memory configured to receive the instruction from the flip-flop, and transmit the instruction to the flip-flop, wherein reception and transmission of the instruction between the flip-flop and the memory are controlled with a signal output by the second portion, wherein the memory comprises:
- a first transistor in which a channel is formed in an oxide semiconductor;
- a first capacitor;
- a second transistor; and
- a second capacitor, wherein one of a source and a drain of the first transistor is electrically connected to the flip-flop, wherein the other of the source and the drain of the first transistor is electrically connected to one of electrodes of the first capacitor, wherein a gate of the first transistor is electrically connected to the second portion, wherein one of a source and a drain of the second transistor is electrically connected to the flip-flop, wherein the other of the source and the drain of the second transistor is electrically connected to one of electrodes of the second capacitor, and wherein a gate of the second transistor is electrically connected to a power supply.

5. The semiconductor device according to claim 4, wherein a capacitance value of the second capacitor is larger than a capacitance value of the first capacitor.

6. A method for driving the semiconductor device according to claim 4, comprising:
- reading a first instruction by the first portion;
- transmitting the first instruction from the flip-flop to the memory;
- reading a second instruction by the first portion;
- operating by the second portion in accordance with the second instruction;
- transmitting back the first instruction from the memory to the flip-flop; and
- operating by the second portion in accordance with the first instruction.

* * * * *